United States Patent
Biggs et al.

(10) Patent No.: US 9,954,159 B2
(45) Date of Patent: Apr. 24, 2018

(54) ELECTRICAL INTERCONNECT TERMINALS FOR ROLLED DIELECTRIC ELASTOMER TRANSDUCERS

(71) Applicant: Parker-Hannifin Corporation, Cleveland, OH (US)

(72) Inventors: Silmon James Biggs, Los Gatos, CA (US); Roger N. Hitchcock, San Leandro, CA (US); Trao Bach Ly, Mountain View, CA (US)

(73) Assignee: PARKER-HANNIFIN CORPORATION, Cleveland, OH (US)

( * ) Notice: Subject to any disclaimer, the term of this patent is extended or adjusted under 35 U.S.C. 154(b) by 589 days.

(21) Appl. No.: 14/421,448

(22) PCT Filed: Aug. 16, 2013

(86) PCT No.: PCT/US2013/055304
§ 371 (c)(1),
(2) Date: Feb. 13, 2015

(87) PCT Pub. No.: WO2014/028822
PCT Pub. Date: Feb. 20, 2014

(65) Prior Publication Data
US 2015/0221851 A1 Aug. 6, 2015

Related U.S. Application Data

(60) Provisional application No. 61/734,622, filed on Dec. 7, 2012, provisional application No. 61/734,616, filed
(Continued)

(51) Int. Cl.
*H01L 41/193* (2006.01)
*H01L 41/047* (2006.01)
(Continued)

(52) U.S. Cl.
CPC .......... *H01L 41/0472* (2013.01); *B32B 37/18* (2013.01); *B32B 38/0012* (2013.01);
(Continued)

(58) Field of Classification Search
CPC .................................................... H01L 41/193
(Continued)

(56) References Cited

U.S. PATENT DOCUMENTS 4,373,525 A  2/1983  Kobayashi
4,455,181 A  6/1984  Lifshin
(Continued)

FOREIGN PATENT DOCUMENTS

EP    0154473 B1    5/1992
JP    2002-503008 A    1/2002
(Continued)

OTHER PUBLICATIONS

Handbook of adhesion technology, vol. 2, 2011, pp. 128, Print and electronic bundle ISBN 978-3-642-01170-2, DOI 10.1007/978-3-642-01169-6.

*Primary Examiner* — J. San Martin
(74) *Attorney, Agent, or Firm* — K&L Gates LLP

(57) ABSTRACT

A dielectric elastomer transducer comprising a first and second ends and first and second electrical terminals connected to the respective first and second ends of the dielectric elastomer transducer is provided. A system also includes a substrate, a conductive flexure with one end attached to the substrate and another end configured to receive a load. A first electrical connector pin is attached to the flexure to receive the first electrical terminal and a second electrical connector pin is attached to the substrate to receive the second electrical terminal. Another system also includes a living hinge flexibly coupling two separate substrates, where at least one
(Continued)

of the substrates is movable in response to energizing the dielectric elastomer transducer.

9 Claims, 31 Drawing Sheets

Related U.S. Application Data on Dec. 7, 2012, provisional application No. 61/734,609, filed on Dec. 7, 2012, provisional application No. 61/719,999, filed on Oct. 30, 2012, provisional application No. 61/717,810, filed on Oct. 24, 2012, provisional application No. 61/683,860, filed on Aug. 16, 2012.

(51) Int. Cl.

| H01L 41/083 | (2006.01) |
| --- | --- |
| H01L 41/27 | (2013.01) |
| H01L 41/053 | (2006.01) |
| B32B 37/18 | (2006.01) |
| B32B 38/00 | (2006.01) |
| H04R 19/04 | (2006.01) |
| H04R 31/00 | (2006.01) |
| B32B 37/14 | (2006.01) |
| B32B 38/10 | (2006.01) |

(52) U.S. Cl.
CPC ........ *H01L 41/0475* (2013.01); *H01L 41/053* (2013.01); *H01L 41/0533* (2013.01); *H01L 41/0836* (2013.01); *H01L 41/193* (2013.01); *H01L 41/27* (2013.01); *H04R 19/04* (2013.01); *H04R 31/00* (2013.01); *B32B 37/144* (2013.01); *B32B 38/10* (2013.01); *B32B 2307/202* (2013.01); *B32B 2307/204* (2013.01); *B32B 2457/00* (2013.01); *H04R 2307/025* (2013.01); *Y10T 29/4913* (2015.01); *Y10T 29/49146* (2015.01); *Y10T 156/1043* (2015.01)

(58) Field of Classification Search
USPC ........................................................ 310/800
See application file for complete search history.

(56) References Cited

U.S. PATENT DOCUMENTS

| 4,561,830 | A | 12/1985 | Bradley |
| --- | --- | --- | --- |
| 4,594,058 | A | 6/1986 | Fischell |
| 4,671,792 | A | 6/1987 | Borsanyi |
| 4,704,369 | A | 11/1987 | Nath et al. |
| 4,728,265 | A | 3/1988 | Cannon |
| 4,808,084 | A | 2/1989 | Tsubouchi et al. |
| 5,057,372 | A | 10/1991 | Imfeld |
| 5,103,211 | A | 4/1992 | Daoud et al. |
| 5,104,707 | A | 4/1992 | Watanabe et al. |
| 5,192,197 | A | 3/1993 | Culp |
| 5,217,355 | A | 6/1993 | Hyman et al. |
| 5,256,474 | A | 10/1993 | Johnston |
| 5,322,975 | A | 6/1994 | Nagy et al. |
| 5,549,544 | A | 8/1996 | Young et al. |
| 5,630,709 | A | 5/1997 | Bar-Cohen |
| 5,637,421 | A | 6/1997 | Poehler et al. |
| 5,674,596 | A | 10/1997 | Johnston |
| 5,798,600 | A | 8/1998 | Sager et al. |
| 5,961,298 | A | 10/1999 | Bar-Cohen et al. |
| 5,964,583 | A | 10/1999 | Danby |
| 6,074,179 | A | 6/2000 | Jokela et al. |
| 6,284,396 | B1 | 9/2001 | Kaule |
| 6,524,675 | B1 | 2/2003 | Mikami et al. |
| 6,544,664 | B1 | 4/2003 | Takahashi |
| 6,685,442 | B2 | 2/2004 | Chinn et al. |
| 6,702,916 | B2 | 3/2004 | Smith |
| 6,807,729 | B2 | 10/2004 | Kawashima et al. |
| 7,353,747 | B2 | 4/2008 | Swayze et al. |
| 7,393,761 | B2 | 7/2008 | Wajda et al. |
| 7,618,680 | B2 | 11/2009 | Gleason et al. |
| 7,735,353 | B2 | 6/2010 | Wagner |
| 7,754,520 | B2 | 7/2010 | Lee |
| 7,883,783 | B2 | 2/2011 | Nagatani |
| 7,930,815 | B2 | 4/2011 | Coleman et al. |
| 7,969,070 | B2 | 6/2011 | Jean-Mistral et al. |
| 7,999,447 | B2 | 8/2011 | Micallef |
| 8,056,618 | B2 | 11/2011 | Wagner et al. |
| 8,667,849 | B2 | 3/2014 | Sato et al. |
| 9,164,202 | B2 | 10/2015 | Batchko et al. |
| 2003/0168936 | A1 | 9/2003 | Everingham et al. |
| 2004/0035472 | A1 | 2/2004 | Teltscher et al. |
| 2004/0160118 | A1* | 8/2004 | Knollenberg ........ G02B 26/06 303/113.1 |
| 2004/0234401 | A1 | 11/2004 | Banister |
| 2004/0242956 | A1 | 12/2004 | Scorvo |
| 2005/0040733 | A1* | 2/2005 | Goldenberg ............ F04B 43/09 310/328 |
| 2005/0238506 | A1 | 10/2005 | Mescher et al. |
| 2008/0248231 | A1 | 10/2008 | Daigaku et al. |
| 2008/0264441 | A1 | 10/2008 | Takagi |
| 2009/0050829 | A1 | 2/2009 | Haynes et al. |
| 2010/0159755 | A1* | 6/2010 | Lin ....................... H01R 9/091 439/834 |
| 2010/0172011 | A1 | 7/2010 | Piroux et al. |
| 2010/0273063 | A1 | 10/2010 | Wallace et al. |
| 2010/0278210 | A1* | 11/2010 | Danley ................... G01N 5/04 374/14 |
| 2011/0025170 | A1* | 2/2011 | Rosenthal ............. A61M 5/142 310/328 |
| 2011/0216389 | A1 | 9/2011 | Piroux et al. |
| 2011/0222138 | A1 | 9/2011 | Piroux et al. |
| 2012/0126959 | A1 | 5/2012 | Zarrabi et al. |
| 2012/0307338 | A1 | 12/2012 | Solarkski et al. |
| 2013/0175151 | A1* | 7/2013 | Cordoba Matilla ... G09B 21/02 200/521 |
| 2013/0207793 | A1 | 8/2013 | Weaber et al. |
| 2015/0119529 | A1 | 4/2015 | Laurino |
| 2016/0204338 | A1 | 7/2016 | Schmeer et al. |
| 2016/0208944 | A1 | 7/2016 | Muir et al. |
| 2016/0230904 | A1 | 8/2016 | Zarrabi et al. |
| 2017/0279031 | A1 | 9/2017 | Yoo et al. |

FOREIGN PATENT DOCUMENTS

| JP | 2013-121269 A | 6/2013 |
| --- | --- | --- |
| WO | WO 2006/071419 A2 | 7/2006 |
| WO | WO 2008/039658 A2 | 4/2008 |
| WO | WO 2012/032437 A1 | 3/2012 |

\* cited by examiner

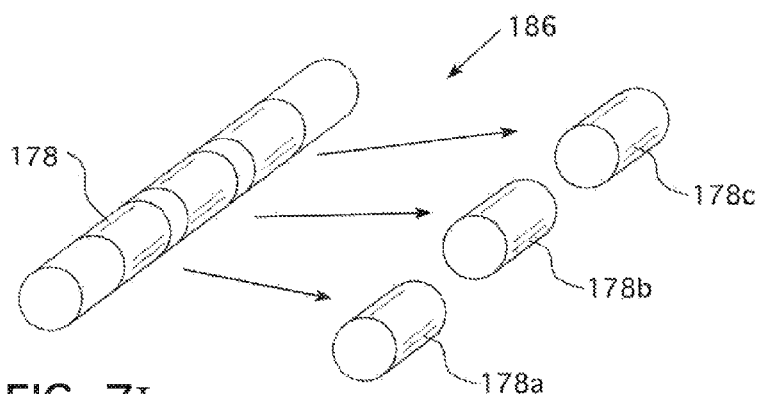
FIG. 7I
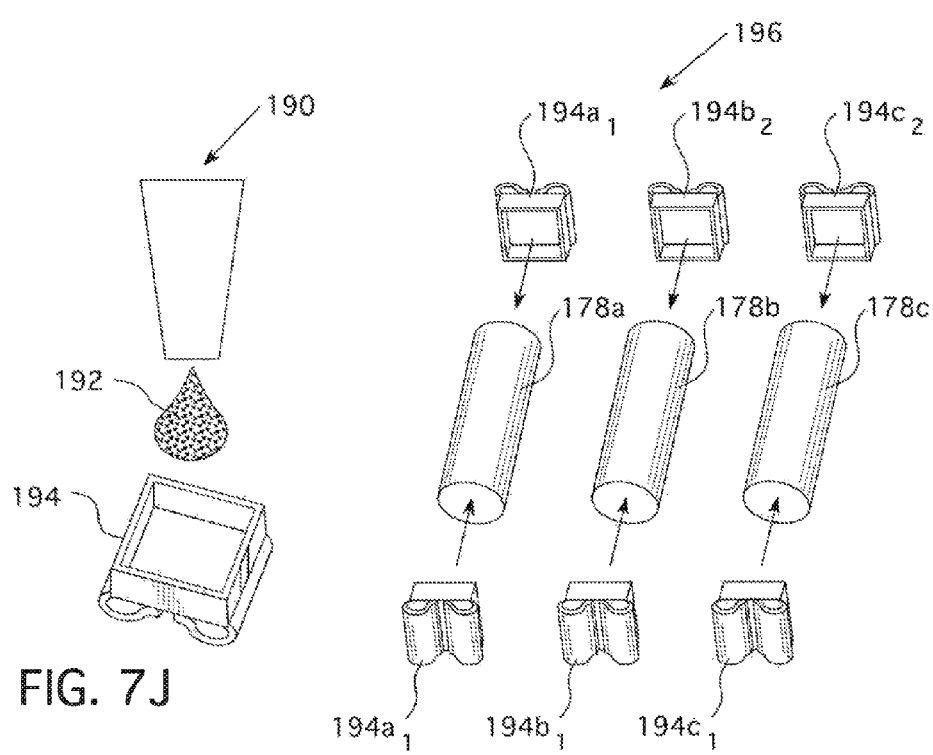
FIG. 7J
FIG. 7K

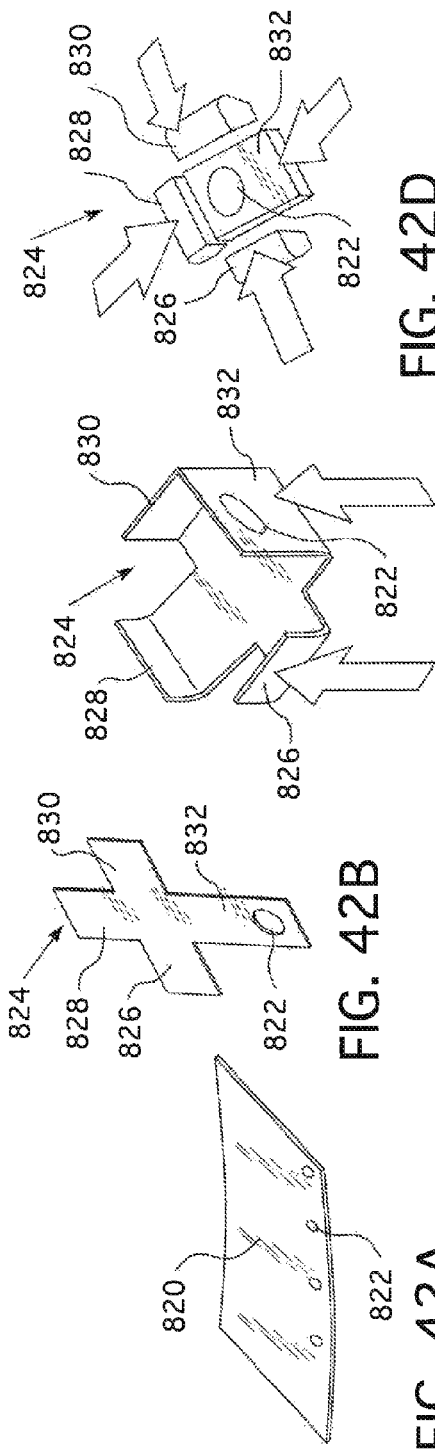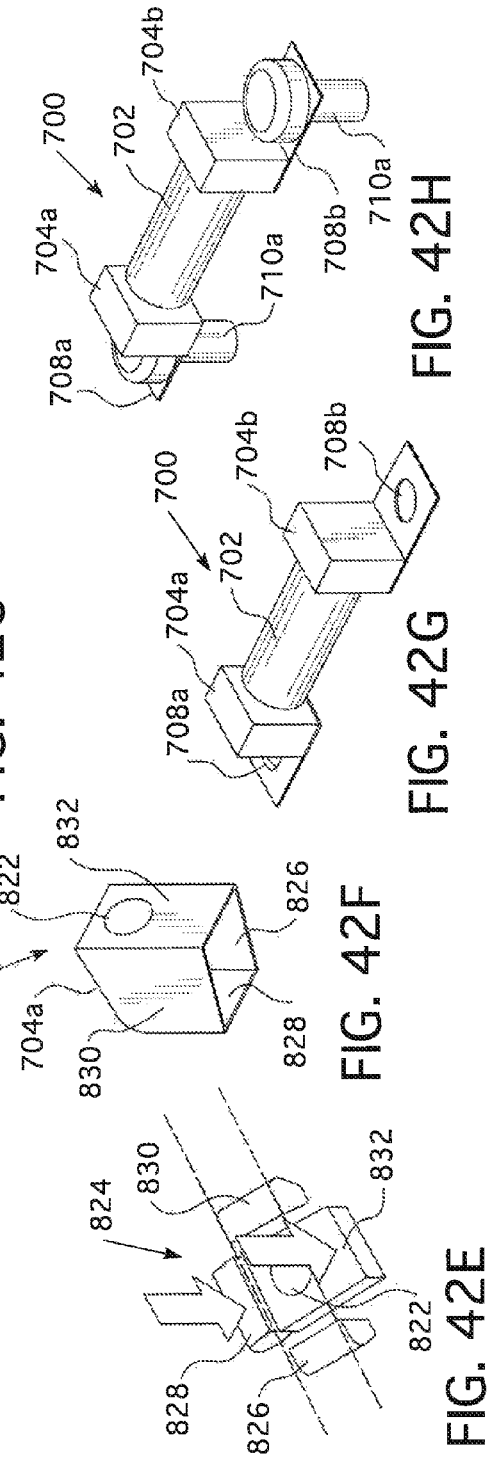

ELECTRICAL INTERCONNECT TERMINALS FOR ROLLED DIELECTRIC ELASTOMER TRANSDUCERS

RELATED APPLICATIONS

This application is the U.S. National Stage application filed under 35 U.S.C. § 371(c) of International Application No. PCT/US2013/055304, filed on Aug. 16, 2013, that claims the benefit, under 35 USC § 119(e), of U.S. Provisional Application Nos. 61/683,860 filed Aug. 16, 2012 entitled "ROLL ACTUATORS IN AXIAL TENSION, MODEL AND DATA"; 61/717,810 filed Oct. 24, 2012 entitled "DIELECTRIC ELASTOMER TRANSDUCER WITH QUICK-CONNECT TERMINALS"; 61/719,999 filed Oct. 30, 2012 entitled "MACHINE AND METHODS FOR MAKING ROLLED DIELECTRIC ELASTOMER TRANSDUCERS"; 61/734,609 filed Dec. 7, 2012 entitled "RESONANT FREQUENCIES"; 61/734,616 filed Dec. 7, 2012 entitled "ROLL ACTUATORS"; and 61/734,622 filed Dec. 7, 2012 entitled "SKIN CONTACT WITH DIELECTRIC ELASTOMER ACTUATORS—SYSTEMS FOR SAFETY"; the entirety of each of which is incorporated herein by reference.

FIELD OF TIE INVENTION

The present invention is directed in general to electroactive polymers and more specifically to electrical interconnect terminals for rolled dielectric elastomer transducer and manufacturing process for making same.

BACKGROUND OF THE INVENTION

A tremendous variety of devices used today rely on actuators of one sort or another to convert electrical energy to mechanical energy. Conversely, many power generation applications operate by converting mechanical action into electrical energy. Employed to harvest mechanical energy in this fashion, the same type of device may be referred to as a generator. Likewise, when the structure is employed to convert physical stimulus such as vibration or pressure into an electrical signal for measurement purposes, it may be characterized as a sensor. Yet, the term "transducer" may be used to generically refer to any of the devices.

A number of design considerations favor the selection and use of advanced dielectric elastomer materials, also referred to as "electroactive polymers", for the fabrication of transducers. These considerations include potential force, power density, power conversion/consumption, size, weight, cost, response time, duty cycle, service requirements, environmental impact, etc. As such, in many applications, electroactive polymer technology offers an ideal replacement for piezoelectric, shape-memory alloy and electromagnetic devices such as motors and solenoids.

An electroactive polymer transducer comprises two electrodes having deformable characteristics and separated by a thin elastomeric dielectric material. When a voltage difference is applied to the electrodes, the oppositely charged electrodes attract each other thereby compressing the polymer dielectric layer therebetween. As the electrodes are pulled closer together, the dielectric polymer film becomes thinner (the Z-axis component contracts) as it expands in the planar directions (along the X- and Y-axes), i.e., the displacement of the film is in-plane. The electroactive polymer film may also be configured to produce movement in a direction orthogonal to the film structure (along the Z-axis), i.e., the displacement of the film is out-of-plane. For example, U.S. Pat. No. 7,567,681 discloses electroactive polymer film constructs which provide such out-of-plane displacement—also referred to as surface deformation or as thickness mode deflection.

The material and physical properties of the electroactive polymer film may be varied and controlled to customize the deformation undergone by the transducer. More specifically, factors such as the relative elasticity between the polymer film and the electrode material, the relative thickness between the polymer film and electrode material and/or the varying thickness of the polymer film and/or electrode material, the physical pattern of the polymer film and/or electrode material (to provide localized active and inactive areas), the tension or pre-strain placed on the electroactive polymer film as a whole, and the amount of voltage applied to or capacitance induced upon the film may be controlled and varied to customize the features of the film when in an active mode.

Numerous applications exist that benefit from the advantages provided by such electroactive polymer films whether using the film alone or using it in an electroactive polymer actuator. One of the many applications involves the use of electroactive polymer transducers as actuators to produce haptic, tactile, vibrational feedback (the communication of information to a user through forces applied to the user's body), and the like, in user interface devices. There are many known user interface devices which employ such feedback, typically in response to a force initiated by the user. Examples of user interface devices that may employ such feedback include keyboards, keypads, game controller, remote control, touch screens, computer mice, trackballs, stylus sticks, joysticks, etc. The user interface surface can comprise any surface that a user manipulates, engages, and/or observes regarding feedback or information from the device. Examples of such interface surfaces include, but are not limited to, a key (e.g., keys on a keyboard), a game pad or buttons, a display screen, etc.

Use of electroactive polymer materials in consumer electronic media devices as well as the numerous other commercial and consumer applications highlights the need to increase production volume and reduce manufacturing cost. There is a need for methods to easily and quickly install electroactive polymer devices. In addition, like incandescent light bulbs, dielectric elastomer transducers occasionally burn out and need to be replaced. It is desirable to minimize the time, effort, and expense required to replace them. Also, it is sometimes desirable to situate actuators directly on a printed circuit board. This can eliminate costs of cables and connectors, and save space. The art discloses many approaches to making electrical and mechanical connections to dielectric elastomer transducers. U.S. Pat. No. 7,915,789 B2, for example, discloses the use of machine screws to make both the electrical and mechanical connections. In U.S. Pat. No. 7,940,476 B2, the electrical connections are made with a conventional flex cable and the mechanical connections are made with screw fasteners. These approaches in the art have some drawbacks. A screwdriver is required to tighten the machine screws in U.S. Pat. No. 7,915,789 B2 which can loosen with use to cause an unreliable electrical contact. The costs of the flex cable and connectors disclosed in U.S. Pat. No. 7,940,476 B2 can be significant.

The present disclosure provides electrical interconnects, such as quick-connect terminals, for dielectric elastomer transducers. The electrical interconnects enable the transducer to be electrically coupled to external systems. The terminals provide both electrical and mechanical connection. A non-limiting illustration of a quick-connect dielectric elastomer transducer is provided by terminals that interface the dielectric elastomer transducer with male connector pins.

SUMMARY OF THE INVENTION

In one embodiment, a dielectric elastomer transducer comprises a first end and a second end, a first electrical terminal connected to the first end of the dielectric elastomer transducer, and a second electrical terminal connected to the second end of the dielectric elastomer transducer.

In another embodiment, a system comprises a solid dielectric elastomer transducer roll comprising a first end and a second end, a first electrical terminal connected to the first end of the solid dielectric elastomer transducer roll, a second electrical terminal connected to the second end of the solid dielectric elastomer transducer roll, a substrate, a conductive flexure comprising one end attached to the substrate and another end configured to receive a load, a first electrical connector pin attached to the flexure to receive the first electrical terminal, and a second electrical connector pin attached to the substrate to receive the second electrical terminal.

In yet another embodiment, a system comprises a solid dielectric elastomer transducer roll comprising a first end and a second end, a first electrical terminal connected to the first end of the solid dielectric elastomer transducer roll, a second electrical terminal connected to the second end of the solid dielectric elastomer transducer roll, a first substrate comprising a first electrical connector pin to receive the first electrical terminal, a second substrate comprising a second electrical connector pin to receive the second electrical terminal, and a living hinge flexibly coupling the first and second substrates. At least one of the first and second substrates is movable in response to energizing the solid dielectric elastomer transducer roll.

These and other features and advantages of the invention will become apparent to those persons skilled in the art upon reading the details of the invention as more fully described below. In addition, variations of the processes and devices described herein include combinations of the embodiments or of aspects of the embodiments where possible are within the scope of this disclosure even if those combinations are not explicitly shown or discussed.

BRIEF DESCRIPTION OF THE DRAWINGS

The invention is best understood from the following detailed description when read in conjunction with the accompanying drawings. To facilitate understanding, the same reference numerals have been used (where practical) to designate similar elements are common to the drawings. Included in the drawings are the following:

FIGS. 7A-7K illustrate a manufacturing process for turning an electroded dielectric film laminate into a solid dielectric elastomer transducer roll, as shown in FIGS. 7I and 7K in accordance with one embodiment of the present invention, where:

FIG. 7A illustrates lamination of dielectric films in accordance with one embodiment of the present invention;

FIG. 7B illustrates cutting a frame away from the dielectric film laminate in accordance with one embodiment of the present invention;

FIG. 7C illustrates removal of the frame from the dielectric film laminate in accordance with one embodiment of the present invention;

FIG. 7D illustrates mounting a carrier plate with the dielectric film laminate on a rolling machine in accordance with one embodiment of the present invention;

FIG. 7E illustrates the process of rolling the dielectric film laminate by moving the carrier plate under a counter rotating scrub roller into a solid roll of dielectric elastomer film in accordance with one embodiment of the present invention;

FIG. 7F illustrates the process of rolling the dielectric film laminate shown in FIG. 7E towards the end of the process in accordance with one embodiment of the present invention;

FIG. 7G illustrates the carrier plate retracting after the rolling process is complete in accordance with one embodiment of the present invention;

FIG. 7H illustrates transfer of a solid dielectric elastomer transducer roll to a cutting fixture for segmenting the roll into individual solid dielectric elastomer transducer rolls shown in FIG. 7G in accordance with one embodiment of the present invention;

FIG. 7I illustrates the solid dielectric elastomer transducer roll segmented into individual solid dielectric elastomer transducer rolls in accordance with one embodiment of the present invention;

FIG. 7J illustrates application of conductive adhesive into a terminal cup for electrically attaching to ends of the solid dielectric elastomer transducer rolls shown in FIGS. 7H and 7I in accordance with one embodiment of the present invention;

FIG. 7K illustrates attaching and curing the terminal cups onto the ends of the solid dielectric elastomer transducer roll shown in FIG. 1 in accordance with one embodiment of the present invention;

FIGS. 42A-42G illustrate a process for manufacturing the ring connect terminal for a solid dielectric elastomer transducer roll shown in FIG. 40 in accordance with one embodiment of the present invention, where:

FIG. 42A illustrates a metal sheet defining apertures that will serve as the ring portion of the ring connect terminal for the solid dielectric elastomer transducer roll shown in FIG. 40 in accordance with one embodiment of the present invention;

FIG. 42B illustrates a metal part stamped out from the metal sheet shown in FIG. 42A in accordance with one embodiment of the present invention;

FIG. 42C illustrates a 90° fold up of the four tabs of the metal component shown in FIG. 42B in the direction of the arrows in accordance with one embodiment of the present invention;

FIG. 42D illustrates a 180° over fold of the four tabs of the metal component shown in FIG. 42C in the direction indicated by the arrows in accordance with one embodiment of the present invention;

FIG. 42E illustrates a 90° down fold of the four tabs of the metal component shown in FIG. 42D in the direction indicated by the arrows in accordance with one embodiment of the present invention;

FIG. 42F is a finished electrical terminal manufactured according with the steps depicted in FIGS. 42A-E in accordance with one embodiment of the present invention;

FIG. 42G illustrates an assembled ring connect solid dielectric elastomer transducer roll in accordance with one embodiment of the present invention;

FIG. 42H illustrates the assembled ring connect solid dielectric elastomer transducer roll shown in FIG. 42G with mounting fasteners provided through corresponding rings of the assembled electrical terminal in accordance with one embodiment of the present invention;

Figure 1:
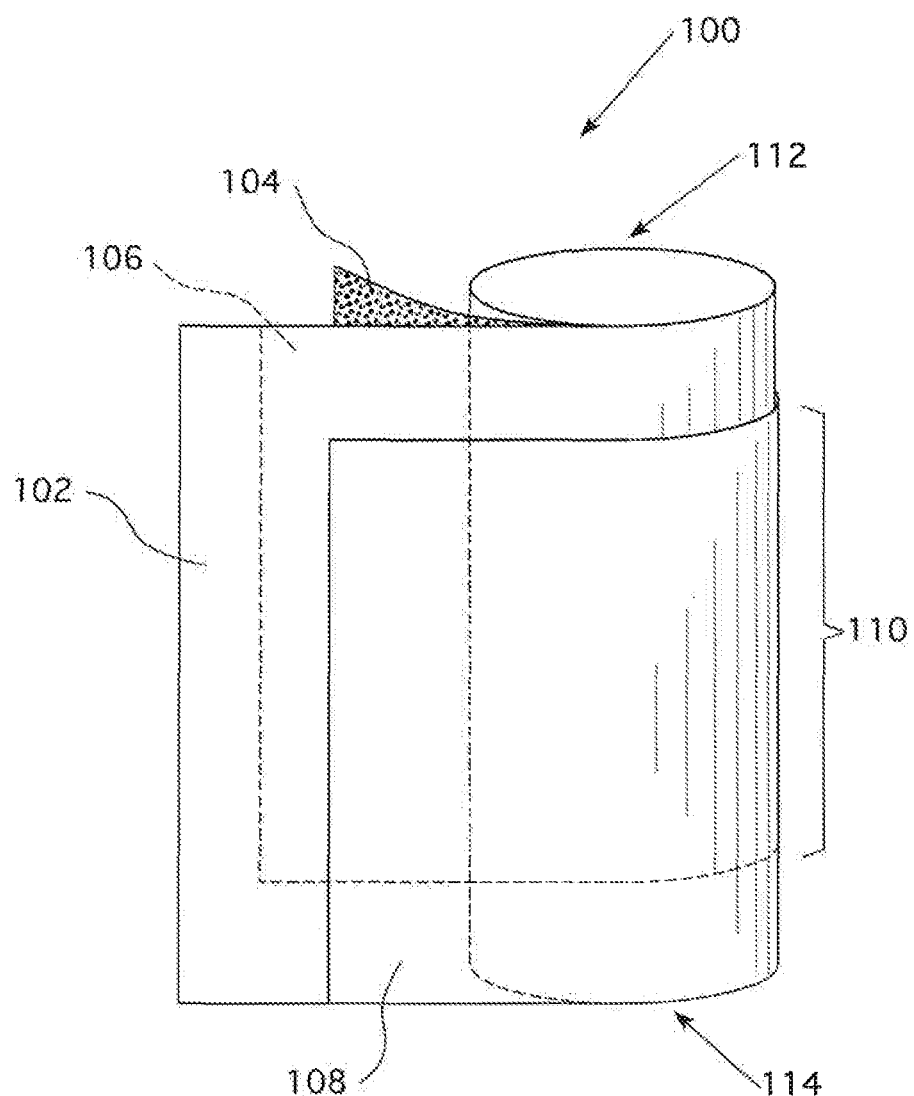
FIG. 1 illustrates a solid dielectric elastomer transducer roll in accordance with one embodiment of the present invention.

Variation of the invention from that shown in the figures is contemplated.

DETAILED DESCRIPTION OF THE INVENTION

Examples of electroactive polymer devices and their applications are described, for example, in U.S. Pat. Nos. 6,343,129; 6,376,971; 6,543,110; 6,545,384; 6,583,533; 6,586,859; 6,628,040; 6,664,718; 6,707,236; 6,768,246; 6,781,284; 6,806,621; 6,809,462; 6,812,624; 6,876,135; 6,882,086; 6,891,317; 6,911,764; 6,940,221; 7,034,432; 7,049,732; 7,052,594; 7,062,055; 7,064,472; 7,166,953; 7,199,501; 7,199,501; 7,211,937; 7,224,106; 7,233,097; 7,259,503; 7,320,457; 7,362,032; 7,368,862; 7,378,783; 7,394,282; 7,436,099; 7,492,076; 7,521,840; 7,521,847; 7,567,681; 7,595,580; 7,608,989; 7,626,319; 7,750,532; 7,761,981; 7,911,761; 7,915,789; 7,952,261; 8,183,739; 8,222,799; 8,248,750; and in U.S. Patent Application Publication Nos.; 2007/0200457; 2007/0230222; 2011/0128239; and 2012/0126959, the entireties of which are incorporated herein by reference.

In various embodiments, the present invention provides various improvements over conventional hollow rolled dielectric elastomer transducers and manufacturing processes for making same. Embodiments of the present invention overcome these drawbacks by winding dielectric elastomer films into a solid roll that does not waste space, and that does not collapse as turns are added. A rolling machine also is disclosed, along with a manufacturing process, materials, and fixtures for manufacturing dielectric elastomer actuator rolls with the machine, as described herein in the detailed description of the invention section of the present disclosure.

In other embodiments, the present invention provides a dielectric elastomer transducer comprising quick-connect terminals for electrically coupling the dielectric elastomer transducer to external systems. The electrical terminals provide both electrical and mechanical connection. A non-limiting example of a quick-connect dielectric elastomer transducer is provided by electrical terminals that interface the dielectric elastomer transducer with male connector pins, such as FASTON quick-connects and terminals by AMP, Inc., for example. The electrical terminal provided in this example comprises two cantilever springs integrated with a cap, all made of an electrically conductive material. The caps are joined to the ends the solid dielectric elastomer transducer roll with conductive adhesive. The spring terminals reversibly engage a male connector pin.

In various embodiments, the present invention provides a dielectric elastomer transducer with quick-connect mounting. An electrically conductive adhesive provides the electrical and mechanical connections of the dielectric elastomer transducer to the terminals that cap it. The terminals comprise cap-like or cup-like regions into which the electrically conductive adhesive can be dispensed. The caps are then attached to the ends of the transducer and the adhesive is cured. A solvent may be added to the electrically conductive adhesive in order to produce a local swelling at the end of the dielectric elastomer transducer where it couples to the adhesive. This swelling separates the layers of the transducer so that the adhesive can penetrate into the interstitial space between layers. Once cured, the inter-digitated layers of adhesive and dielectric provide a connection that is mechanically and electrically robust. The terminals may be configured to adapt the dielectric elastomer transducer to the FASTON connector standard. The quick-connect dielectric elastomer transducer can be mounted on a printed circuit board (PCB)-mountable conductive flexure with one or more male pins sized for female FASTON terminals, for example. The flexure is soldered in an offset and/or angled orientation in order to leave a gap between the male pins that is slightly longer than the rest-length of the dielectric elastomer transducer. Mounting the dielectric elastomer transducer in the gap produces the desired pre-strain. The dielectric elastomer transducer also can be combined with a living hinge where an actuator enables direct movement of a substrate to which the transducer is coupled. The substrate itself thus becomes a component in various systems, such as positioners, ailerons, flow restrictor valves, pumps, among others.

Various embodiments of such electrical interconnect terminals for rolled dielectric elastomer transducer rolls are described hereinbelow in connection with FIGS. 35-49. However, prior to describing FIGS. 35-49, the present disclosure initially turns to a description of FIGS. 1-34 to provide a context for the description that follows.

The various embodiments discussed hereinbelow in connection with FIGS. 1-19 provide a dielectric elastomer transducer rolls formed by rolling laminated films into a compact spiral, which will be referred to herein as "solid." Multiple individual solid dielectric elastomer transducer rolls may be produced by segmented cutting of the transducer rolls, where the cutting affords electrical connections to the ends of the rolls. A conductive adhesive formulated with solvent may be used to swell the ends of the roll to improve mechanical and electrical connection of the rolls to the terminals. Also provided is a rolling machine for dielectric elastomer actuators comprised of a scrub roller that counter-rotates with respect to an advancing plate. Another rolling machine is provided in which motion control is simplified by spinning the scrub roller faster than the carrier plate advances. A non-stick textile cover for the scrub roller is provided to minimize adhesion by minimizing contact area through the use of knit threads that can locally deflect to minimize contact stress. An electrode pattern is also provided for transducer rolls in which electrodes overlap to support areas of the roll that could otherwise buckle and initiate wrinkles. Also provided are novel fixtures for cutting the roll and adhering terminals, to be used in conjunction with the rolling machine.

The solid transducer rolls overcome buckling problems that normally would limit the number of turns that can be added to a hollow type transducer roll. Solid transducer rolls also save space that is wasted by the hollow type rolls known in the art. A rolling machine forms solid rolls with geometric tolerances finer than hand-rolling, at greater speed and lower cost. A compliant, textile, non-stick cover for the scrub roller in the machine simplifies motion control and reduces machine cost. An overlapping electrode pattern prevents wrinkles.

FIG. 1 illustrates a solid dielectric elastomer transducer roll 100 in accordance with one embodiment of the present invention. The solid dielectric elastomer transducer roll 100 comprised of two layers of dielectric film 102, 104, one of which has been patterned with one or more layers of electrodes 106, 108 on both sides. The layers of dielectric film 102, 104 are wound together into a tight solid spiral cylinder. The area 110 in which the electrodes 106, 108 overlap acts as a dielectric elastomer transducer. Electrical connection to the two plates of the capacitor can be made where the electrodes 106, 108 meet the ends of the cylinder. The electrodes 106, 108 are offset relative to each other to provide electrical connection at the ends 112, 114 of the solid dielectric elastomer transducer roll 100 such that the first electrode 106 is accessible at the top 112 and the second electrode 108 is accessible at the bottom 114 of the transducer 100. Although in the illustrated embodiment, the solid dielectric elastomer transducer roll 100 has a right circular cylindrical form, other forms are contemplated such as triangular, square, rectangular, among other polyhedral forms.

Figure 2:
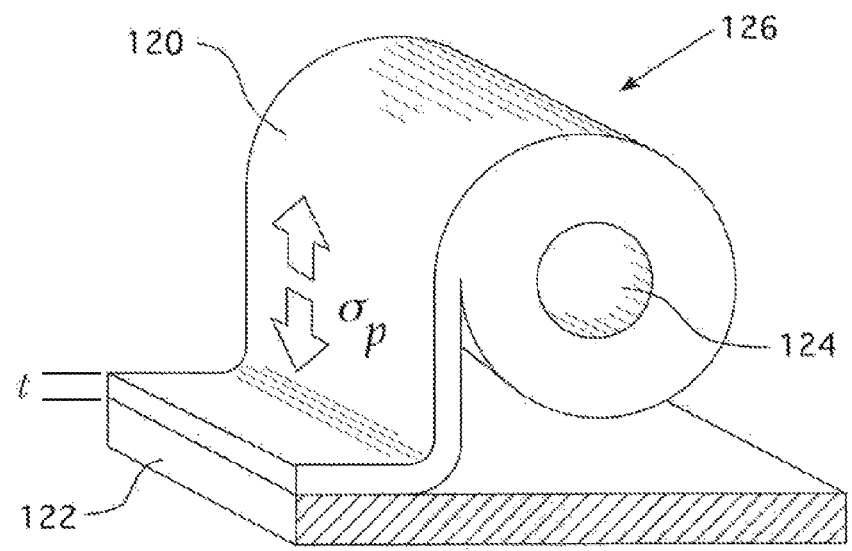
FIG. 2 illustrates tension $\sigma_p$, that accumulates when removing film from a liner while winding a hollow rolled dielectric elastomer transducer.

FIG. 2 illustrates tension $\sigma_p$ that accumulates when removing film 120 from a liner 122 while winding a hollow 124 rolled dielectric elastomer transducer 126. Some peeling stress $\sigma_p$ is unavoidable when removing the film 120 having a thickness "t" from the liner 122.

Figure 3:
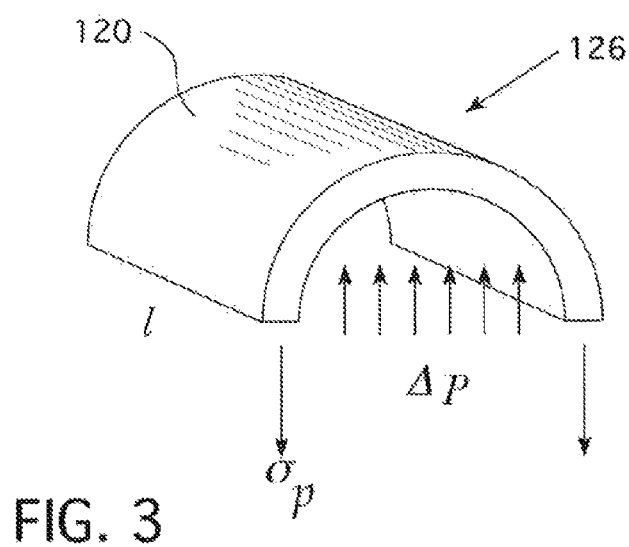
FIG. 3 illustrates radial stress $\Delta P$ developed in the hollow dielectric elastomer transducer rolls shown in FIG. 2 caused by the tension $\sigma_p$.

FIG. 3 illustrates radial stress $\Delta P$ developed in the hollow rolled dielectric elastomer transducer 126 shown in FIG. 2 caused by the tension $\sigma_p$ created when the film 120 is peeled from the liner 122 (not shown). Radial stress $\Delta P$ (pressure) in the compressed layers below must support the tension of each new wrap.

Figure 4:
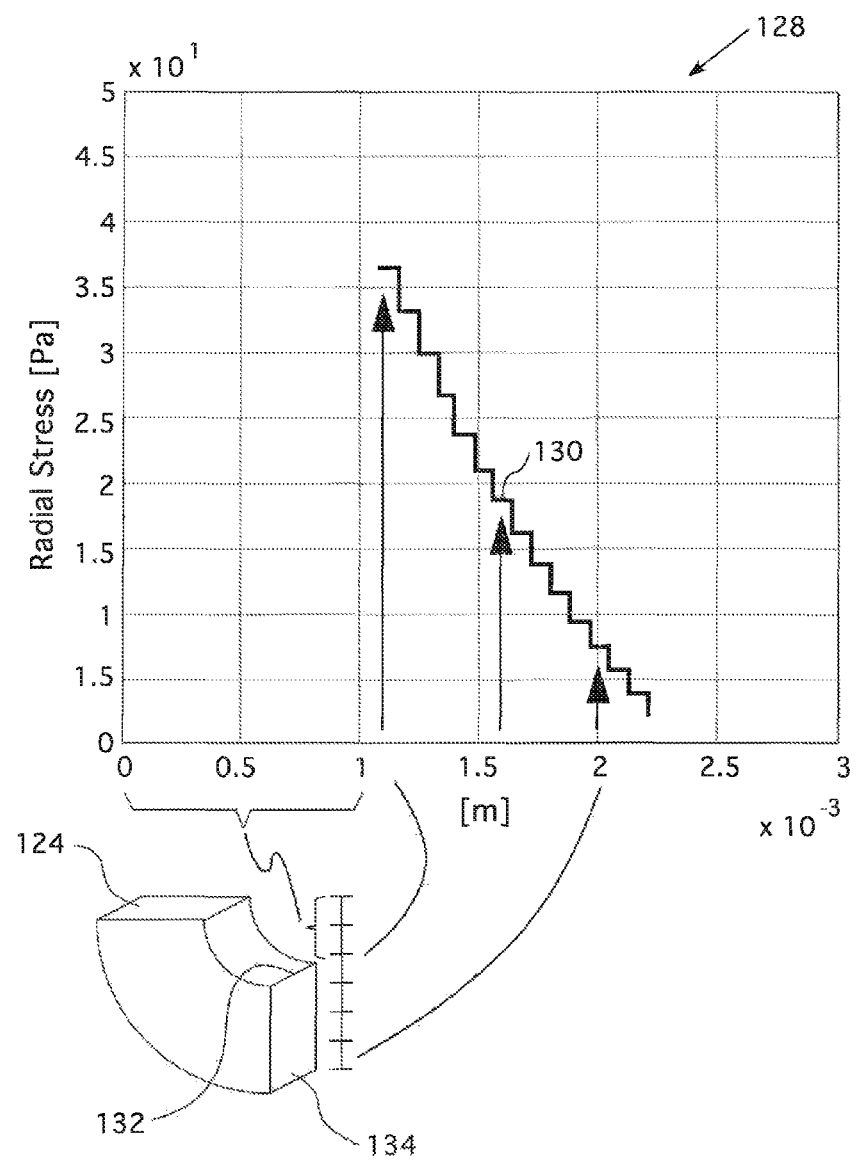
FIG. 4 is a graphical illustration depicting the accumulation of radial stress $\Delta P$ in the hollow dielectric elastomer transducer rolls shown in FIG. 2 as additional wraps are added to the hollow rolled dielectric elastomer transducer.

FIG. 4 is a graphical illustration depicting the accumulation of radial stress $\Delta P$ in the hollow rolled dielectric elastomer transducer 126 shown in FIG. 2 as additional wraps are added to the hollow rolled dielectric elastomer transducer 126. As more wraps are added the radial stress $\Delta P$ (pressure) in the center increases. If the force becomes large enough, the inner layers may delaminate and buckle, like an arch collapsing. As indicated by the radial stress $\Delta P$ [Pa] versus radial distance [m] curve 130 in graph 128, the radial stress $\Delta P$ on the innermost layer 132 is much higher than the radial stress $\Delta P$ on the outermost layer 134.

In the context of FIGS. 2-4, the peel stress $\sigma_p$ and strain in a single layer of dielectric film 120 are given below for values typical of a dielectric elastomer coating:

$$\sigma_p = \frac{\sigma_{PEEL}}{t} = \frac{[3.8 \ N/m]}{[80E-6 \ m]} = 0.048 \ \text{MPa} \quad \text{Eq. 1}$$

$$s = \frac{\sigma_p}{Y} = \frac{[0.048 \ \text{MPa}]}{[0.6 \ \text{MPa}]} = 0.08 = 8\% \ \text{strain} \quad \text{Eq. 2}$$

The force balance for a half-wrap of film, as shown in FIG. 3, can be solved for the radial stress $\Delta P$.

$$\sum F_z = -2\sigma_p t l + 2r l \Delta P = 0 \quad \text{Eq. 3}$$

$$\Delta P = \frac{\sigma_p t}{r} = \frac{\sigma_{PEEL}}{r} \quad \text{Eq. 4}$$

The radial stress $\Delta P$ in layer "i" is due to the accumulated stress of the layers above it as given in the equation below. For typical values of peel stress $\sigma_p$ on a hollow rolled dielectric elastomer transducer 126 with 1 mm internal radius, the calculated pressures have been plotted in FIG. 4.

$$P_i = \Delta P_i + \sum_0^{i-1} \Delta P \quad \text{Eq. 5}$$

Figure 5:
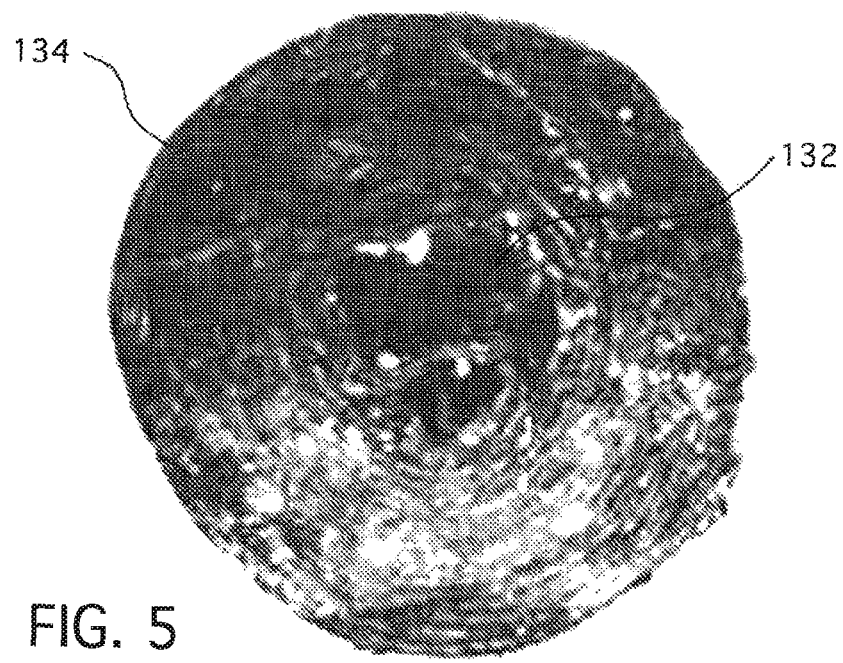
FIG. 5 illustrates inner windings of a hollow dielectric elastomer transducer rolls that have collapsed under the accumulated radial stress P imposed by tension $\sigma_p$ in the outer windings.

FIG. 5 illustrates inner windings 132 of the hollow rolled dielectric elastomer transducer 126 that have collapsed under the accumulated radial stress P imposed by tension $\sigma_p$ in the outer windings 134. This "collapsing of the inner layers" problem with the conventional hollow rolled dielectric elastomer transducer 126 provides the motivation for the present inventors' development of the solid dielectric elastomer transducer roll 100 shown in FIG. 6.

Figure 6:
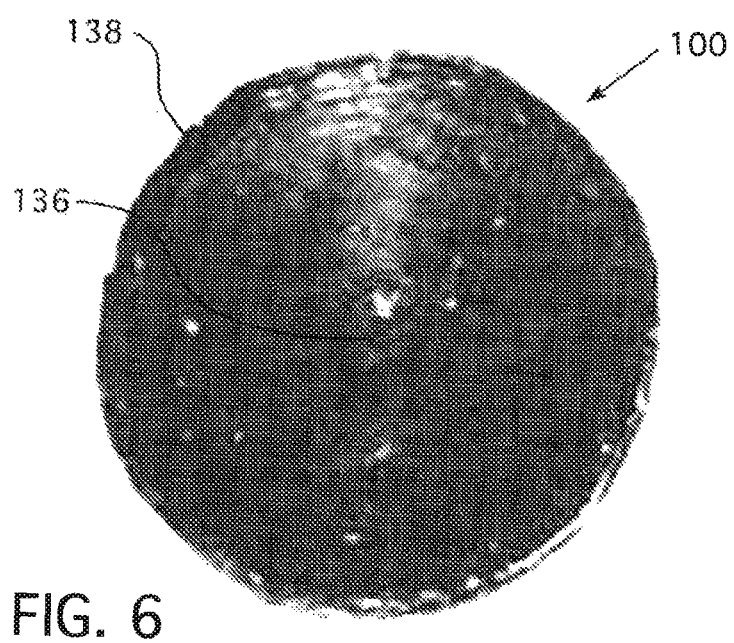
FIG. 6 illustrates a cylindrical solid dielectric elastomer transducer roll in accordance with one embodiment of the present invention.

FIG. 6 illustrates a cylindrical solid dielectric elastomer transducer roll 100 in accordance with one embodiment of the present invention. The cylindrical solid dielectric elastomer transducer roll 100 does not exhibit a collapse of the inner layers 136 under the accumulated radial stress P imposed by tension $\sigma_p$ in the outer windings 138.

Figure 7A:
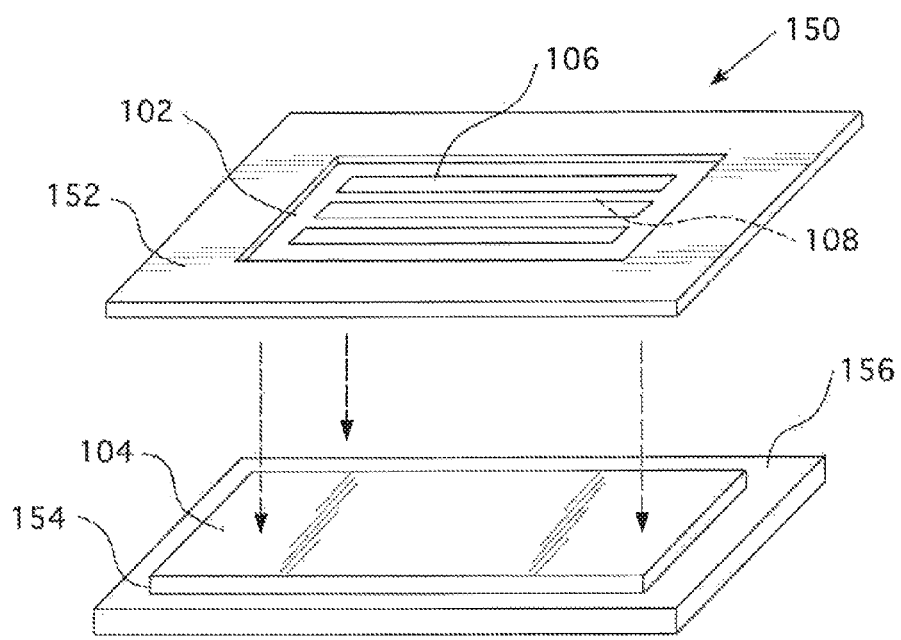

FIGS. 7A-7K illustrate a manufacturing process for turning an electroded dielectric film laminate 101 into a solid dielectric elastomer transducer roll 178, as shown in FIGS. 7I and 7K in accordance with one embodiment of the present invention. The process rolls the dielectric film laminate 101 into a tight spiral without an opening extending axially in the center of the solid dielectric elastomer transducer roll 178.

FIG. 7A illustrates a step of the process where two dielectric films 102, 104 are laminated 150 in accordance with one embodiment of the present invention. The first dielectric film 102 comprises a first electrode layer 106 on a top portion and a second electrode layer 108 on a bottom portion. The first dielectric film 102 with the electrodes 106, 108 patterned on both sides thereof are held in tension (pre-stressed) in a rigid frame 152. The first film 102 with the frame 152 is then laminated to the second dielectric film 104 while it is still attached to the liner 154 used to coat it. The electroded dielectric film laminate 101 (not shown in FIG. 7A) comprising the laminated films 102, 104 is positioned on a carrier plate 156, which will be used to hold the dielectric film laminate 101 during the rolling process.

Figure 7B:
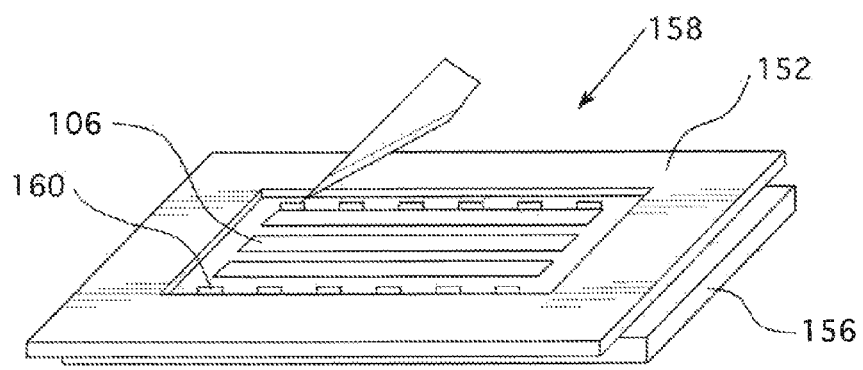

FIG. 7B illustrates another step of the process where the frame 152 is cut 158 away from the dielectric film laminate 101 (not shown in FIG. 7B) in accordance with one embodiment of the present invention. The cut path 160 is inside the inner perimeter of the frame 152.

Figure 7C:
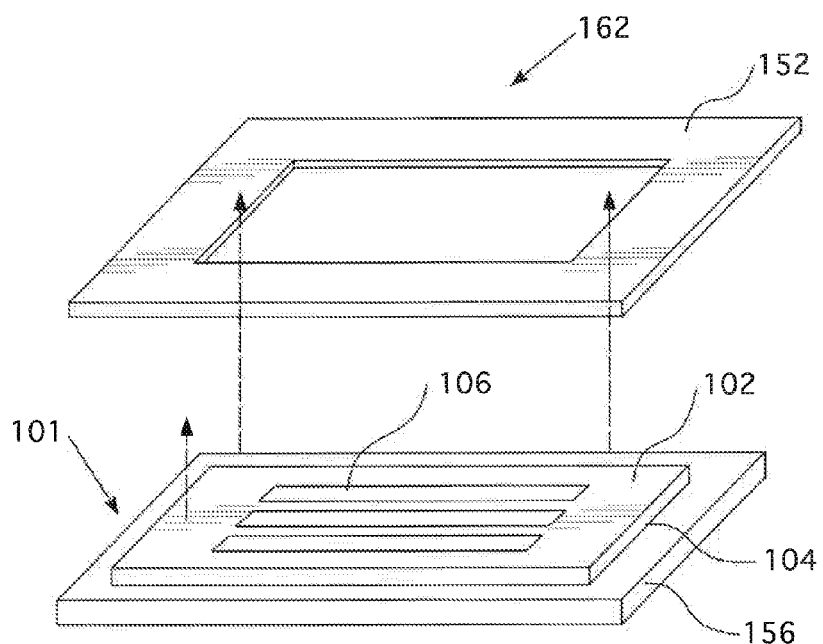

FIG. 7C illustrates another step of the process where the frame 152 is removed 162 from the dielectric film laminate 101 in accordance with one embodiment of the present invention.

Figure 7D:
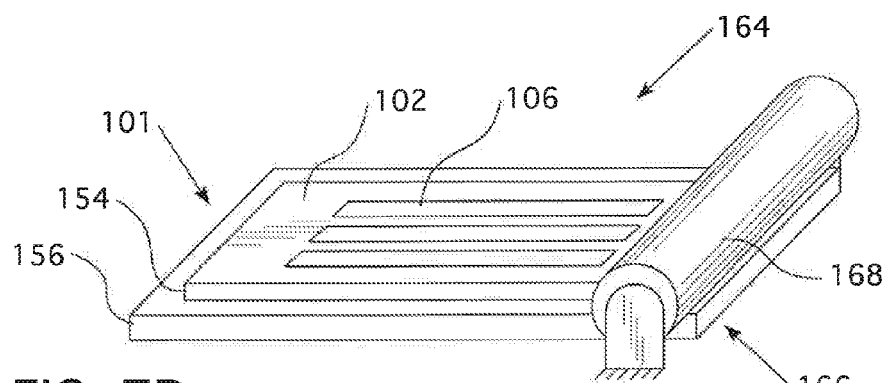

FIG. 7D illustrates another step of the process where the carrier plate 156 with the dielectric film laminate 101 is mounted 164 on a rolling machine 166 in accordance with one embodiment of the present invention. The rolling machine 166 comprises a scrub roller 168, which rolls up the dielectric film laminate 101.

Figure 7E:
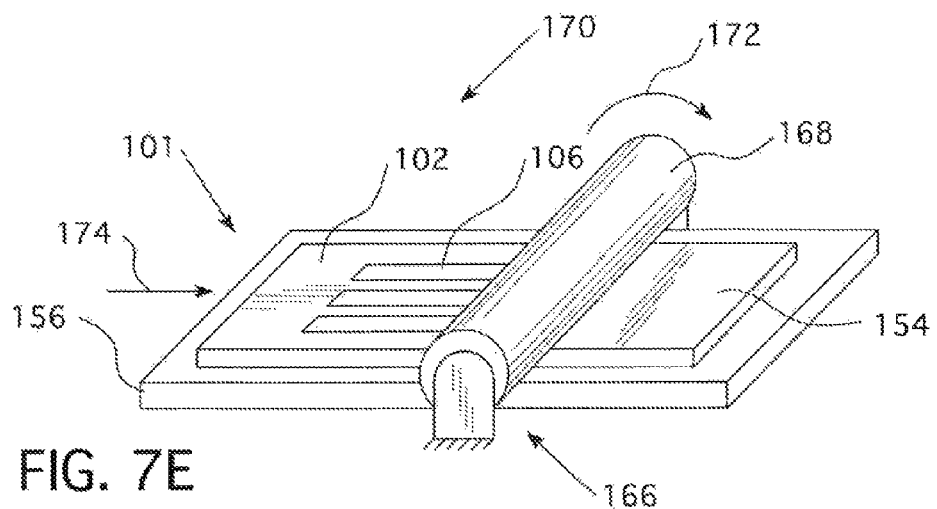
Figure 7F:
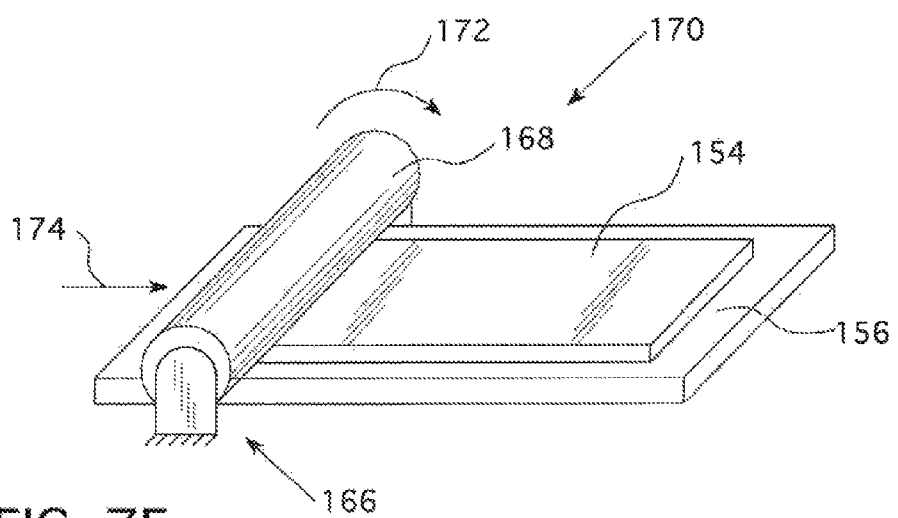

FIG. 7E illustrates another step in the process where the dielectric film laminate 101 on the carrier plate 156 is rolled into a solid roll of dielectric elastomer film under a counter rotating 172 scrub roller 168 as the carrier plate 156 is moved 170 in direction 174 by a conveyor or other suitable drive mechanism in accordance with one embodiment of the present invention. As the dielectric film laminate 101 is rolled, it is released from the liner 154. The process continues until the entire dielectric film laminate 101 is rolled. FIG. 7F illustrates the process of rolling the dielectric film laminate 101 shown in FIG. 7E towards the end of the process in accordance with one embodiment of the present invention.

Figure 7G:
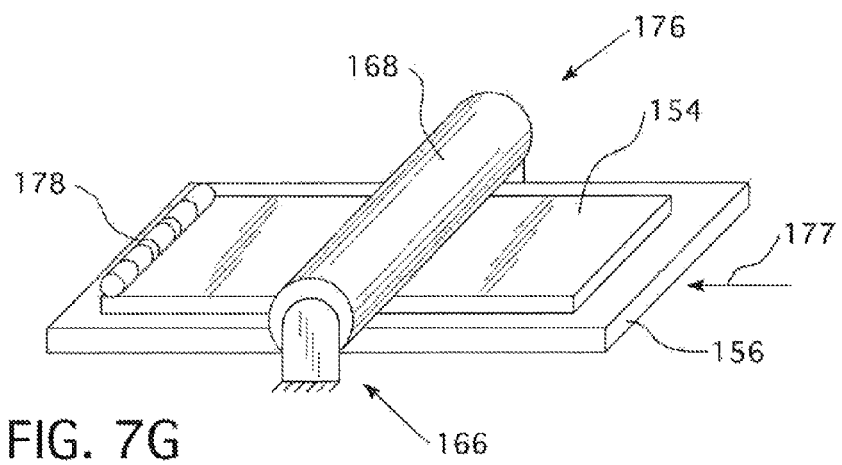

FIG. 7G illustrates another step of the process where the carrier plate 156 is retracted 176 in direction 177 after the rolling process is complete in accordance with one embodiment of the present invention. As shown, a solid dielectric elastomer transducer roll 178 is provided at the end of this step.

Figure 7H:
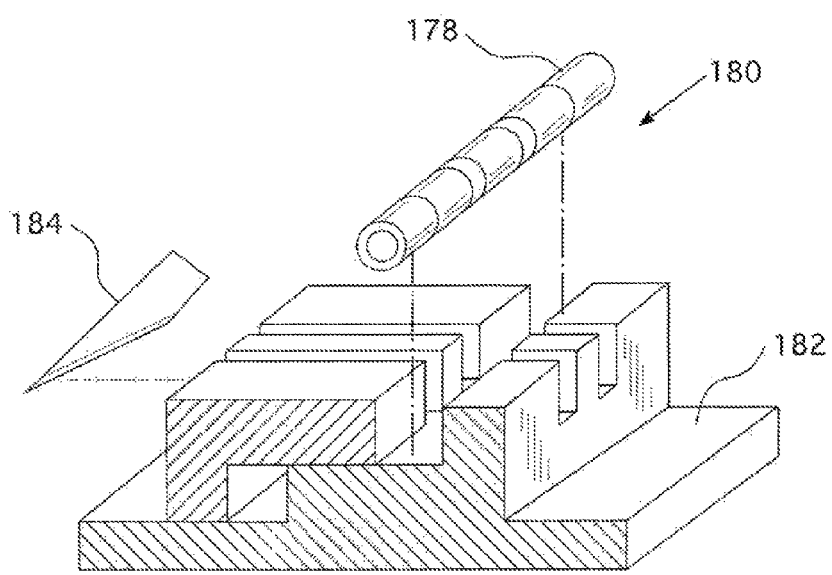

FIG. 7H illustrates another step in the process where the solid dielectric elastomer transducer roll 178 is transferred 180 to a cutting fixture 182 for segmenting the roll 178 with a cutter 184, such as a blade or slitter, into individual solid dielectric elastomer transducer rolls shown in FIG. 7G in accordance with one embodiment of the present invention.

FIG. 7I illustrates another step in the process where the solid dielectric elastomer transducer roll 178 is segmented 186 into individual solid dielectric elastomer transducer rolls 178a, 178b, and 178e in accordance with one embodiment of the present invention.

FIG. 7J illustrates another step in the process where a conductive adhesive 192 is applied 190 into an electrical terminal 194 having a cup shape for electrically attaching to ends of the solid dielectric elastomer transducer rolls 178a, 178b, and 178c shown in FIGS. 7H and 7I in accordance with one embodiment of the present invention.

FIG. 7K illustrates another step in the process where terminals $194a_1$, $194a_2$ are attached and cured 196 onto the ends of the solid dielectric elastomer transducer roll 178a, terminals $194b_1$, $194b_2$ are attached and cured 196 onto the ends of the solid dielectric elastomer transducer roll 178b, and terminals $194c_1$, $194c_2$ are attached and cured 196 onto the ends of the solid dielectric elastomer transducer roll 178c in accordance with one embodiment of the present invention.

Figure 8:
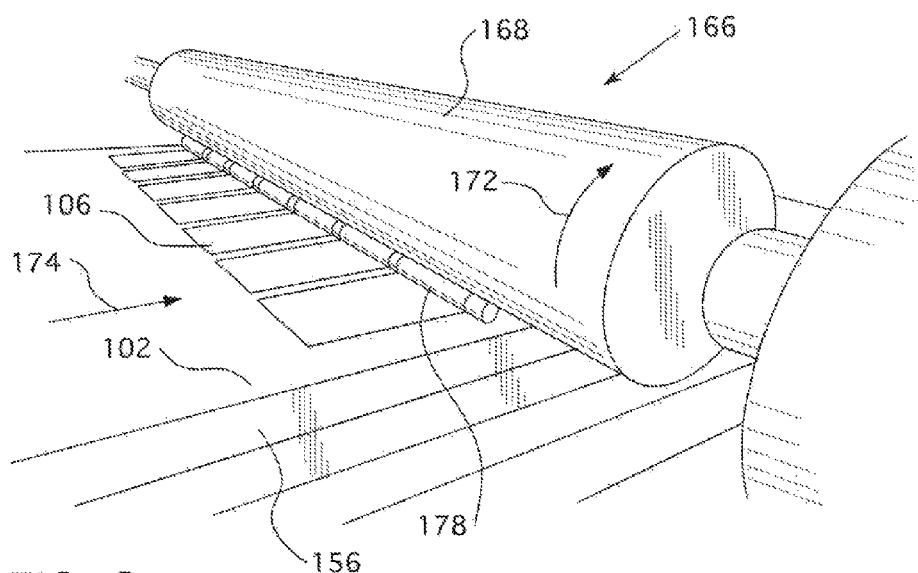
FIG. 8 is a detail view of the rolling machine used in steps illustrated in FIGS. 7D-F in accordance with one embodiment of the present invention.

FIG. 8 is a detail view of the rolling machine 166 used in the steps illustrated in FIGS. 7D-G in accordance with one embodiment of the present invention.

Figure 9:
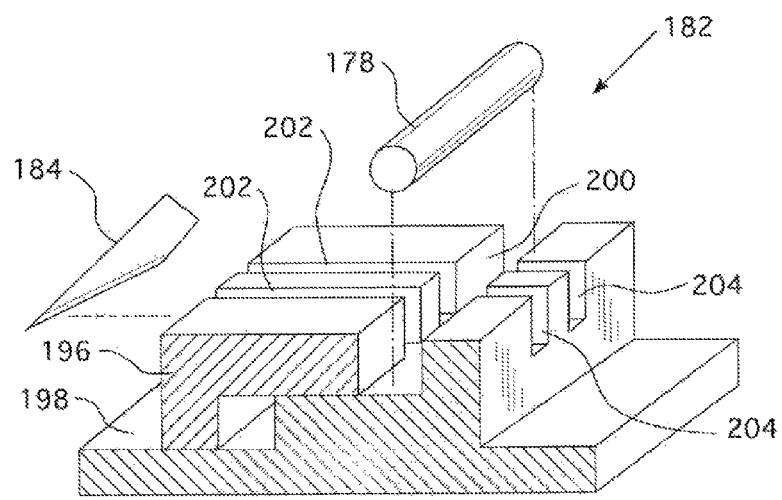
FIG. 9 is a detail view of the cutting fixture for segmenting the solid dielectric elastomer transducer roll into individual solid dielectric elastomer transducer rolls shown in FIGS. 7H and 7J in accordance with one embodiment of the present invention.

FIG. 9 is a detail view of the cutting fixture 182 for segmenting the solid dielectric elastomer transducer roll 178 into individual solid dielectric elastomer transducers rolls 178a, 178b, and 178c shown in FIGS. 7h and 7J in accordance with one embodiment of the present invention. The cutting fixture 182 comprises a movable jaw 196 and a fixed jaw 198. The movable jaw comprises alignment slots 202 and the fixed jaw comprises alignment slots 204, which are aligned with the alignment slots 202 of the movable jaw 202. The cutting fixture comprises an aperture for receiving the solid dielectric elastomer transducer roll 178 therein. The movable jaw 196 moves relative to the fixed jaw 198 to define a longitudinal aperture 200 for receiving and holding the solid dielectric elastomer transducer roll 178 in place during the segmenting process. The cutter 184 is advanced through the alignment slots 202 in the movable jaw 196, through the solid dielectric elastomer transducer roll 178, and the alignment slots 204 in the fixed jaw 198. The clamping action of the jaws 196, 198 also straightens the solid dielectric elastomer transducer roll 178 within the aperture 200 in preparation for segmentation.

Figure 10:
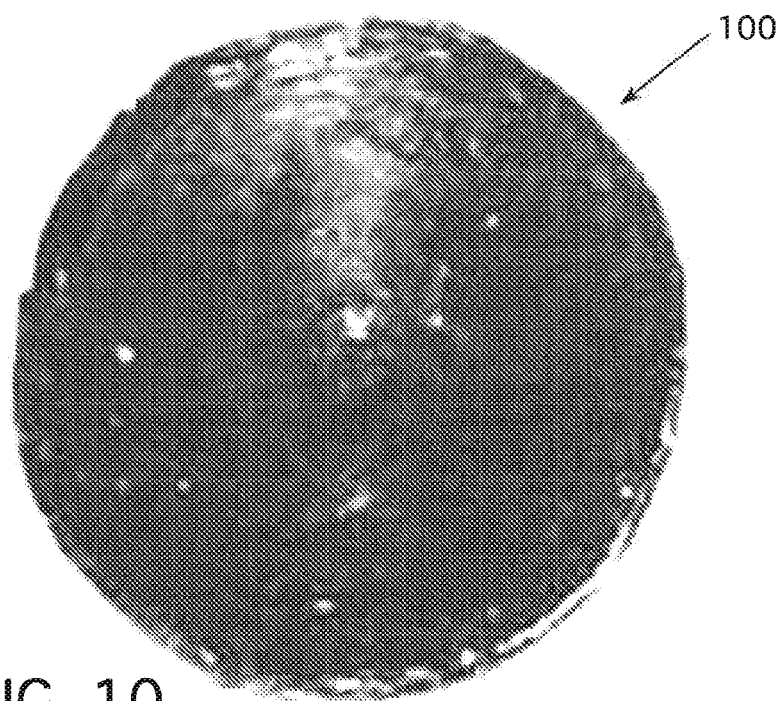
FIG. 10 is an end view of an individual segmented solid dielectric elastomer transducer roll in accordance with one embodiment of the present invention after segmentation and prior to exposing the end to a solvent.

FIG. 10 is an end view of an individual segmented solid dielectric elastomer transducer roll 100 in accordance with one embodiment of the present invention after segmentation and prior to exposing the end to a solvent.

Figure 11:
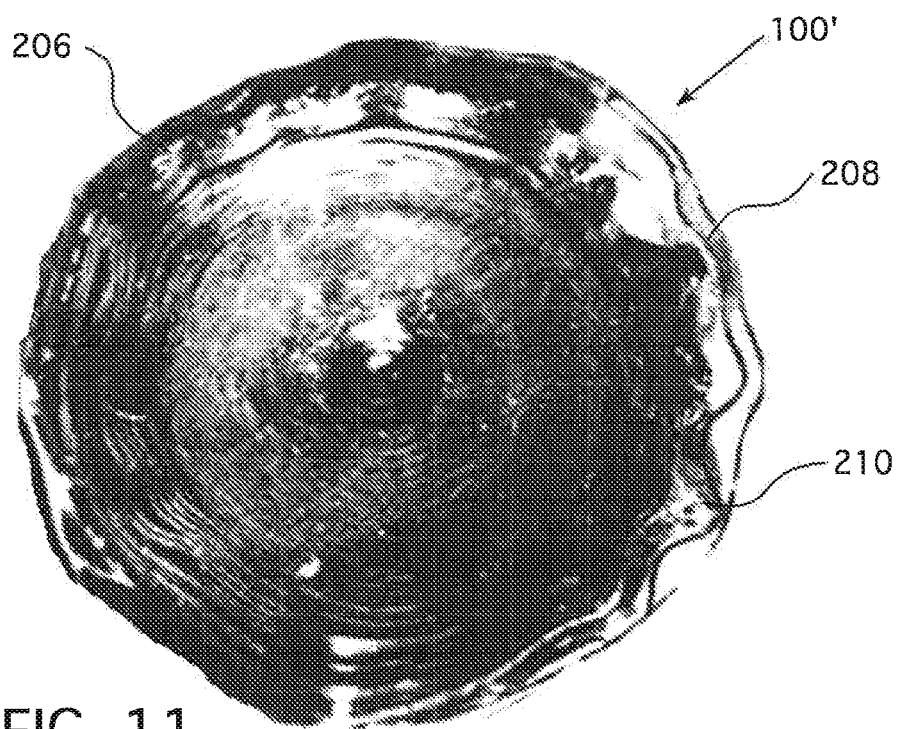
FIG. 11 is an end view of an individual segmented solid dielectric elastomer transducer roll after the application of a solvent to cause local swelling and separation of the layers in accordance with one embodiment of the present invention.

FIG. 11 is an end view of an individual segmented solid dielectric elastomer transducer roll 100' after the application of a solvent to the end to cause local swelling and separation of the layers 206, 208, and 210 in accordance with one embodiment of the present invention. This improves penetration of the conductive adhesive 192, shown in FIG. 7J. During the curing process 196 shown in FIG. 7K, the solvent evaporates, leaving inter-digitated glue that makes a robust electrical and mechanical connection between the capping end-terminal 194 shown in FIGS. 7J and 7K and the electrodes 106, 108 of the solid dielectric elastomer transducer roll 100. In one embodiment, the electrically conductive adhesive 192 may be formulated with a solvent that swells the ends of the roll 100 to improve mechanical and electrical connection of the rolls 100 to the terminals 194.

Figure 12:
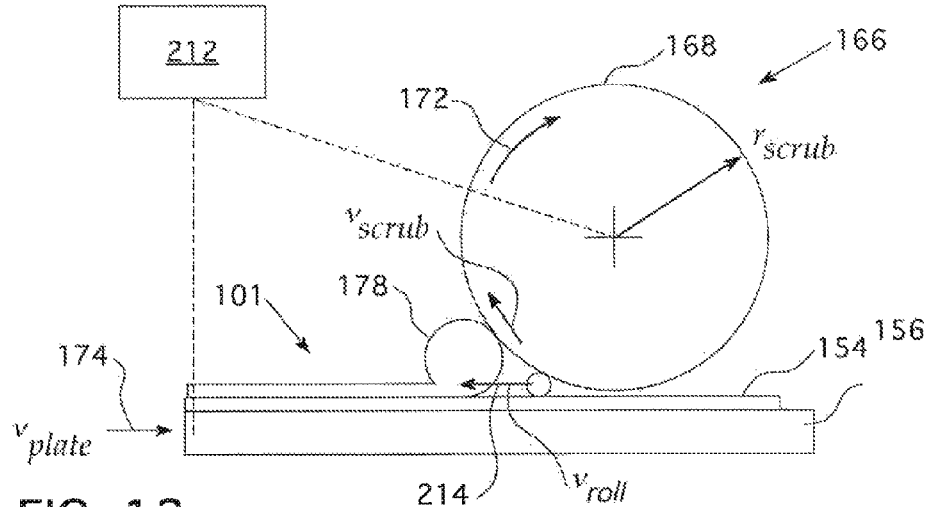
FIG. 12 illustrates a motion control system for controlling the rolling process of rolling up a solid dielectric elastomer transducer roll with a carrier plate under a scrub roller as illustrated in FIGS. 7D-F and FIG. 8 in accordance with one embodiment of the present invention.

FIG. 12 illustrates a motion control system 212 for controlling the process of rolling the dielectric film laminate 101 into a solid dielectric elastomer transducer roll 178 with the rolling machine 166. The scrub roller 168 portion of the rolling machine 166 has a radius $r_{scrub}$. The motion control system 212 may be any electronic processor or digital logic based programmable motion controller configured to control the velocity and direction of rotation of the scrub roller 168 and the velocity and direction of translation of the carrier plate 156 in accordance with the present invention. As previously discussed in connection with FIGS. 7D-G, the carrier plate 156 is advanced in direction 174 at velocity $V_{plate}$ while the scrub roller 168 is rotated in a counter direction 172 at velocity $V_{scrub}$. As the outer surface of the scrub roller 168 contacts the dielectric film laminate 101, the dielectric film laminate 101 begins to roll up to form the solid dielectric elastomer transducer roll 178. The solid dielectric elastomer transducer roll 178 grows in diameter until the carrier plate 156 reaches the end of stroke. As matching the speeds of the carrier plate 156 and the scrub roller 168 can improve the rolling process and excess speed on the carrier plate 156 can jam the solid dielectric elastomer transducer roll 178 under the scrub roller 168. On the other hand, if the solid dielectric elastomer transducer roll 178 is sticky and adheres to the scrub roller 168, excess velocity on the scrub roller 168 can lift the solid dielectric elastomer transducer roll 178 off the liner 154 and wrap it around the scrub roller 168. Each of these situations can result in damaging the solid dielectric elastomer transducer roll 178. Accordingly, the motion control system 212 may be programmed in accordance with the following considerations to provide various levels of control ranging from the simple to the complex.

By way of example, the motion control system 212 may be configured in various forms from a relatively simple control system to a more complex control system. In one embodiment, the control system 212 may be configured to match the velocity of the carrier plate 156 $V_{plate}$, in direction 174 and the velocity of the scrub roller 168 $V_{scrub}$ in direction 172 such that $|V_{plate}|=|V_{scrub}|$. In another embodiment, the motion control system 212 may be configured to account for the velocity of the transducer roll $V_{roll}$ in direction 214 as a new variable to compensate for the movement of the center of the solid dielectric elastomer transducer roll 178 as the diameter grows such that $|V_{plate}|-|V_{roll,x}|=|V_{scrub}|$. In yet another embodiment, the motion control system 212 may be configured to account for a stretch coefficient "k" to compensate for stretching of the dielectric film laminate 101 as it is peeled from the liner 154 such that $|V_{plate}|-|V_{roll,x}|=k|V_{scrub}|$. Finally, in another embodiment, the motion control system 212 may be configured to employ at least one sensor to sense force and provide a closed loop feedback mechanism to the motion control system 212.

The complexity of the various configurations of the motion control system 212 outlined above can be avoided if the solid dielectric elastomer transducer roll 178 does not stick to the scrub roller 168. In that case, the scrub roller 168 can be rotated quickly relative to the carrier plate 156 so that it always brushes the solid dielectric elastomer transducer roll 178 back, as illustrated below in FIG. 13.

Figure 13:
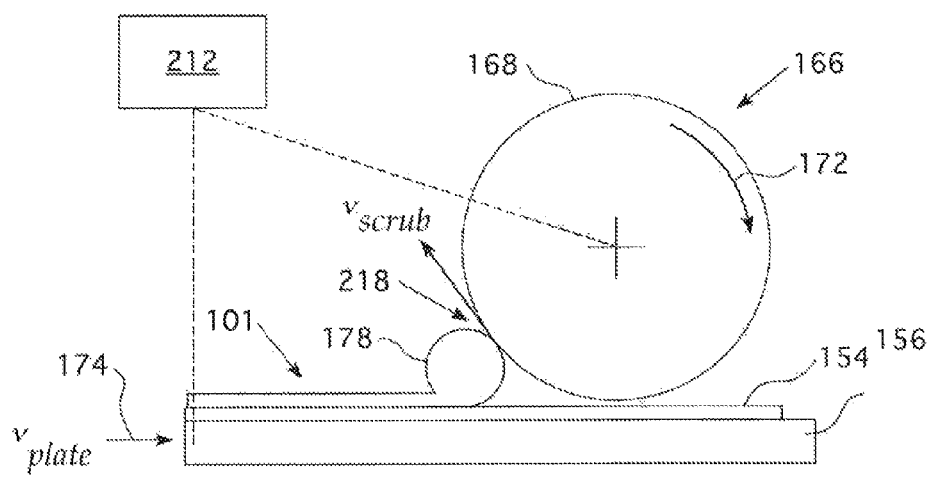
FIG. 13 illustrates a simplified motion control system for the rolling process illustrated in FIGS. 7D-F and FIG. 8 where slip can occur between the scrub roller and a growing solid dielectric elastomer transducer roll in accordance with one embodiment of the present invention.

FIG. 13 illustrates a simplified implementation of the motion control system 212 that is configured to account for slip 218 that can occur between the scrub roller 168 and the growing diameter of the solid dielectric elastomer transducer roll 178. Accordingly, the motion control system 212 may be configured to control the velocity of the carrier plate 156 $V_{plate}$ in direction 174 relative to the velocity of the scrub roller 168 $V_{scrub}$ in direction 172 such that $|V_{plate}|<<|V_{scrub}|$.

Figure 14:
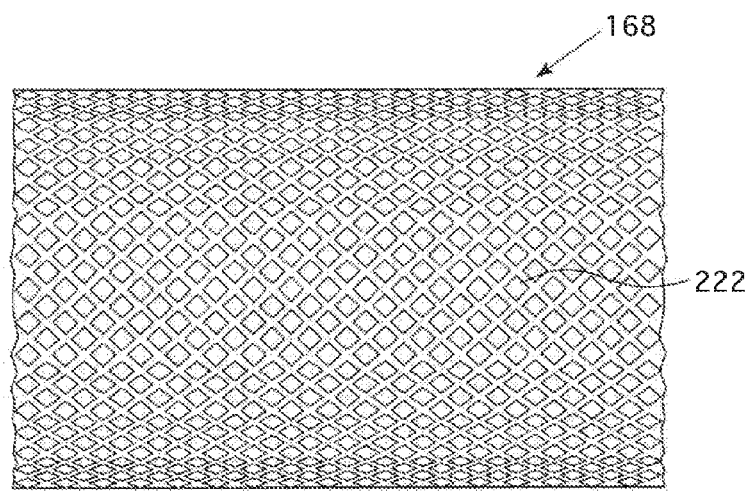
FIG. 14 illustrates a textile covering positioned over an outside surface of the scrub roller illustrated in FIG. 13 in accordance with one embodiment of the present invention.
Figure 15:
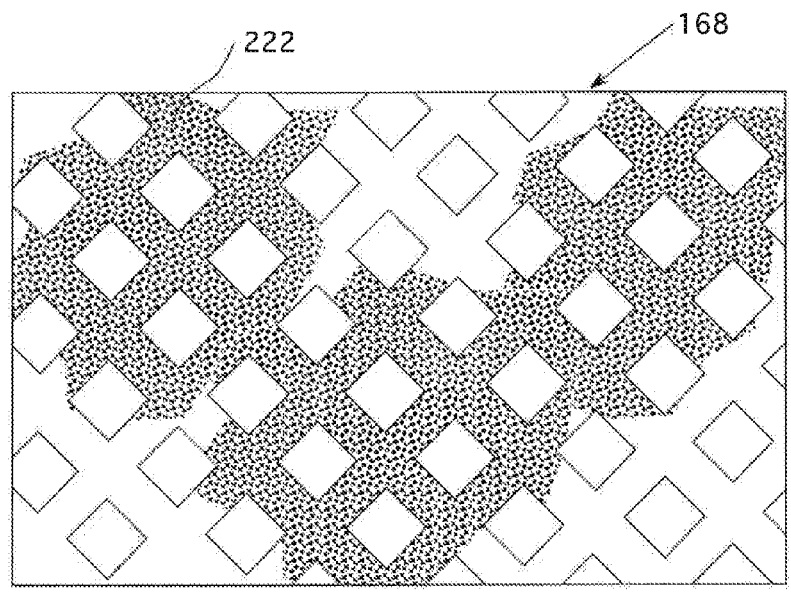
FIG. 15 is a detailed view of the textile covering illustrated in FIG. 14 in accordance with one embodiment of the present invention.

FIG. 14 illustrates a textile covering 222 positioned over an outside surface of the scrub roller 168 illustrated in FIG. 13. The textile covering 222 is made of a non-stick material to provide non-stick contact between the scrub roller 168 and the solid dielectric elastomer transducer roll 178 in accordance with one embodiment of the present invention. FIG. 15 is a detailed view of the textile covering 222 provided over the outside surface of the scrub roller 168 as illustrated in FIG. 14 in accordance with one embodiment of the present invention. With reference to FIGS. 14 and 15, a suitable non-stick contact between the scrub roller 168 and the solid dielectric elastomer transducer roll 178 may be achieved by covering the scrub roller with a knit fabric 222. The knit fabric 222 minimizes the dielectric-to-roller contact area and thus minimizes the adhesion force. The knit fabric 222 insures that the contact area is primarily empty air. Because the knit fibers can deflect, stress concentrations on the solid dielectric elastomer transducer roll 178 film are smaller than those provided by, for example, a roller made of a hard grooved plastic. This protects the solid dielectric elastomer transducer roll 178 from mechanical damage during the rolling process.

Figure 16:
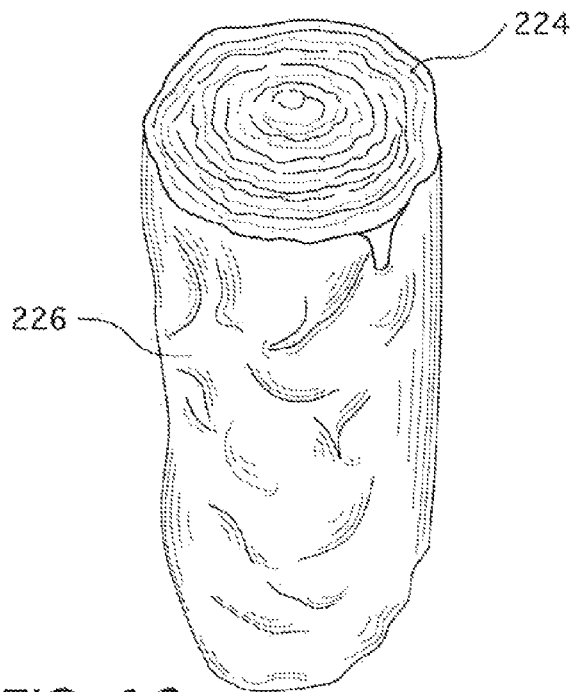
FIG. 16 illustrates circumferential lengthening of outer layers of solid dielectric elastomer transducer roll caused by rolling a pre-strained dielectric elastomer film with excessive pre-strain during the rolling process.

FIG. 16 illustrates circumferential lengthening of outer layers of the dielectric elastomer transducer roll 224 caused by rolling a pre-strained dielectric elastomer film with excessive pre-strain during the rolling process. An advantage of the rolling process according to one embodiment of present invention is the ability to apply a minimum of pre-strain to the dielectric elastomer transducer roll during the rolling process. In one aspect, the minimum pre-strain is only the pre-strain required for peeling the dielectric film laminate from the liner during the rolling process. This is useful because excessive pre-strain can cause relaxation of longitudinal pre-strain that can lead circumferential lengthening of the outer layers 226 of the transducer roll 224. As shown in FIG. 16, the outer layers 224 of the transducer roll 224 have delaminated in some places and not others, causing buckling. So, even if the inner layers of the transducer roll 224 do not buckle, the outer layers 224 may slip. This problem with pre-strain may be minimized by rolling up the unstrained dielectric film laminate directly from the liner on which it was coated in accordance with one embodiment of the present invention.

Figure 17:
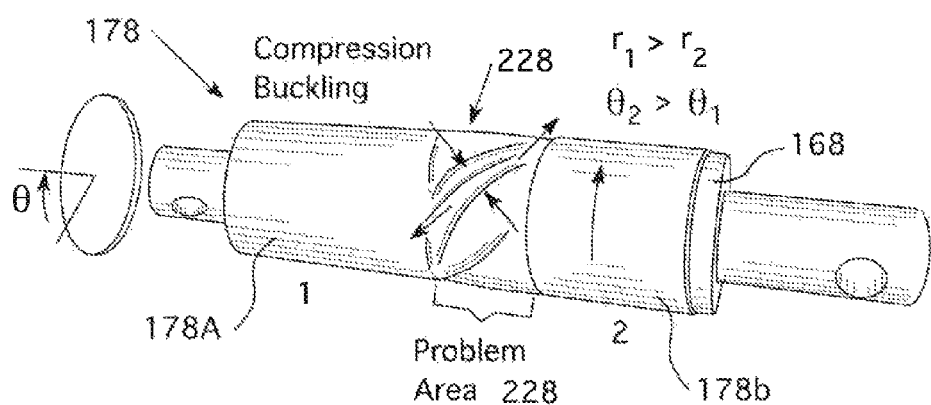
FIG. 17 illustrates a wrinkle mechanism in the loosely packed space between individual solid dielectric elastomer transducer rolls in accordance with one embodiment of the present invention.

FIG. 17 illustrates a wrinkling mechanism in the loosely packed space between individual electroded solid dielectric elastomer transducer rolls 178a, 178b in accordance with one embodiment of the present invention. The bands 226 of un-electroded film in between electroded solid dielectric elastomer transducer rolls 178a, 178b can cause rolling problems. The dielectric layers in these bands 226 are supported only loosely by underlying layers, and can therefore buckle 228 in response to non-uniform rotation along the length of the roll 168. This is illustrated in FIG. 17, where the electroded solid dielectric elastomer transducer rolls 178a, 178b have undergone slightly different rotation relative to the rotation rates of the band 226 therebetween. The electroded solid dielectric elastomer transducer rolls 178a, 178b portions of the transducer roll 178 are supported by the electrodes whereas the band 226 therebetween is unsupported and can buckle. The force of peeling the laminate film from the liner can also produce V-shaped wrinkles in these bands 226. The wrinkles propagate along the length of the roll as turns are added, which is undesirable. To minimize this problem, the regions of adjacent electroded solid dielectric elastomer transducer rolls 178a, 178b can be overlapped as described hereinbelow in FIG. 18.

Figure 18:
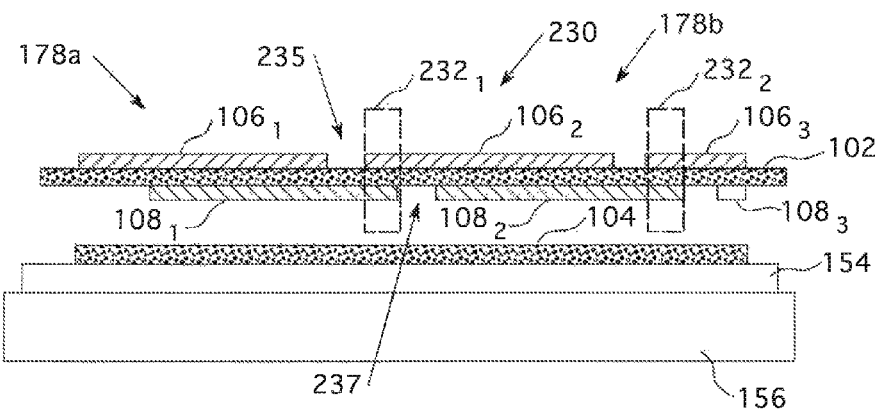
FIG. 18 illustrates an electrode pattern with overlap regions to provide support in bands between solid dielectric elastomer transducer rolls to prevent wrinkles that would otherwise start in the overlapping regions.

FIG. 18 illustrates an electrode pattern 230 with overlapping regions 232 to provide support in bands between adjacent (juxtaposed) layers of electrode materials to be segmented into individual solid dielectric elastomer transducer rolls 178a, 178b. The electrode pattern 230 prevents wrinkles that would otherwise start in the overlapping regions 232 and also enables segmenting the roll into individual solid dielectric elastomer transducer rolls 178a, 178b. The first dielectric film 102 is shown delaminated from the second dielectric film 104 for illustration purposes. As shown, the first and second electrodes 106, 108 are applied on opposite sides of the dielectric film 102 in a staggered (offset) manner to create overlapping regions 232. A first side of the dielectric film 102 includes multiple layers of electrode $106_1$, $106_2$, and $106_3$ material juxtaposed relative to each other and spaced apart by a gap 235 therebetween. A second side of the dielectric film 102 includes multiple layers of electrode $108_1$, $108_2$, and $108_3$ material juxtaposed relative to each other and spaced apart by a gap 237 therebetween. The layers of electrodes $106_1$, $106_2$, and $106_3$ on the first side of the dielectric film 102 are offset or staggered from the layers of electrodes $108_1$, $108_2$, $108_3$ on the second side of the dielectric film 102 to create the overlapping regions $232_1$, $232_2$ and so on. The second dielectric film 104 is still releasably attached to the liner 154 which is attached to the carrier plate 156. As previously discussed, the first dielectric film 102 with the electrodes $106_1$, $106_2$, $106_3$, $108_1$, $108_2$, and $108_3$ formed on each side thereof is laminated to the second dielectric film 104 on the liner 154.

Figure 19:
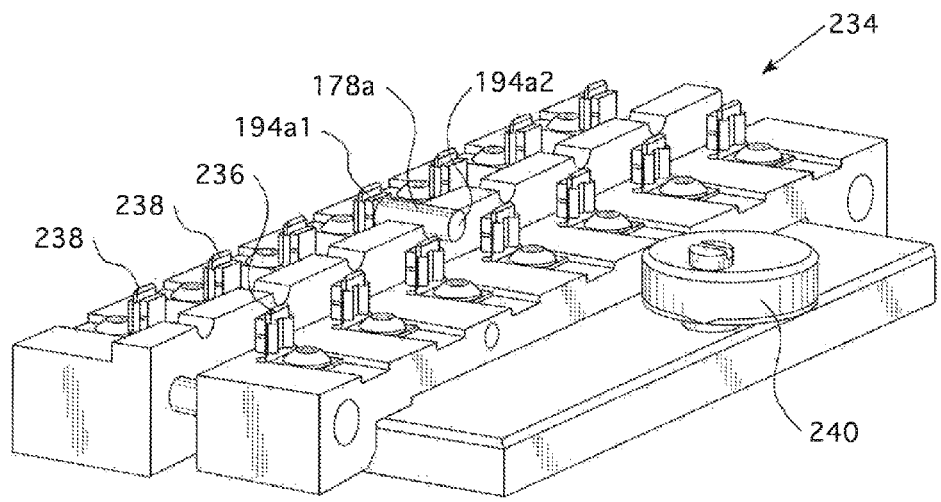
FIG. 19 illustrates a non-limiting example fixture for positioning electrical terminal caps on ends of a solid dielectric elastomer transducer roll during curing.

FIG. 19 illustrates a non-limiting example of fixture 234 for positioning the electrical terminal caps $194a_1$, $194a_2$ on ends of a solid dielectric elastomer transducer roll 178a during curing. The fixture 234 comprises a slot 236 to receive the solid dielectric elastomer transducer roll 178a and blade terminals 238 for receiving the electrical terminal caps $194a_1$, $194a_2$. As previously discussed in FIGS. 7I and 7J, the electrical terminal caps $194a_1$, $194a_2$ are filled with an electrically conductive adhesive 192. The ends of the solid dielectric elastomer transducer roll 178a are then inserted into each one of the conductive adhesive 192 filled electrical terminal caps $194a_1$, $194a_2$ and then a cam 240 is used to apply a clamping force to the assembled solid dielectric elastomer transducer roll 178a and conductive adhesive 192 filled electrical terminal caps $194a_1$, $194a_2$ during the curing process.

Having described embodiments of solid dielectric elastomer transducer rolls, methods for manufacturing the solid dielectric elastomer transducer rolls, and machines for manufacturing the solid dielectric elastomer transducer rolls, the specification now turns to a description of capacitance models for a solid dielectric elastomer transducer roll in axial tension and compression modes as well as radial (flat mode) compression modes.

Figure 20:
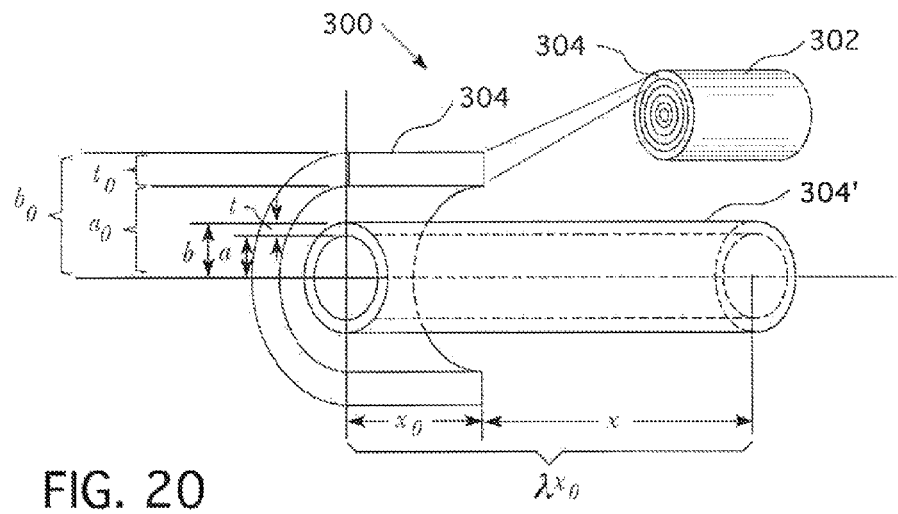
FIG. 20 illustrates a derivation model of a solid dielectric elastomer transducer roll in accordance with one embodiment of the present invention.

FIG. 20 illustrates a derivation model 300 of a solid dielectric elastomer transducer roll 302, similar to the solid dielectric elastomer transducer roll 100, 178 described above, in accordance with one embodiment of the present invention. The diagram depicted in FIG. 20 shows the solid dielectric elastomer transducer roll 302 in a relaxed state and also shows a comparison of an outer ring 304 of the solid dielectric elastomer transducer roll 302 in a relaxed state and the outer ring 304' when it is in tension. The solid dielectric elastomer transducer roll 302 has a length $x_o$ when the solid dielectric elastomer transducer roll 302 is not in tension and a length $(x_o+x)$ or $\lambda x_o$ when tensioned. The model assumes the spiral equivalent of N rings and the volume inside each ring is conserved due to the incompressibility of the rings within and the volume of the ring itself is conserved. Each ring is an annular capacitor and the total capacitance is the sum of the all N rings.

The main equations developed in accordance with the model are:

| | | |
|---|---|---|
| Effective Number of Rings in Roll | $N = \left(\frac{y_0}{t_0\pi}\right)^{1/2}$ | Eq. 6 |
| Blocked Force | $F_{total} = V^2\pi\varepsilon\varepsilon_0 \sum_{n=1}^{N}(\ln(n+1)-\ln(n))^{-1}$ | Eq. 7 |
| Spring Rate | $k = Y(y_0+y_p)t_0/(x_0+x_p)$ | Eq. 8 |
| Free Stroke | $\Delta x \cong \dfrac{F_{total}}{k}$ | Eq. 9 |
| Roll Diameter | $D_{composite} = 2N(t_{film}+t_{elec})$ | Eq. 10 |

The outer ring 304 of the un-tensioned solid dielectric elastomer transducer roll 302 has an outer radius $b_o$ that is equal to the N rings of thickness $t_o$:

$$b_0 = Nt_0 \quad \text{Eq. 11}$$

The area of the film is same whether it is laid out flat $(y_{0t})$ or rolled up into a circle $(\pi b^2_0)$:

$$A_{film} = y_0 t = \pi b_0^2 \quad \text{Eq. 12}$$

$$y_0 t_0 = \pi(Nt_0)^2 \quad \text{Eq. 13}$$

$$Nt_0 = \left(\frac{y_0 t_0}{\pi}\right)^{1/2} \quad \text{Eq. 14}$$

$$N = \left(\frac{y_0}{t_0\pi}\right)^{1/2} \quad \text{Eq. 15}$$

Volume Inside Each Ring is Conserved $$\text{Volume}_0 = \text{Volume}(\lambda) \quad \text{Eq. 16}$$

$$\text{Volume}_0 = \pi a_0^2 x_0 \quad \text{Eq. 17}$$

$$\text{Volume}(\lambda) = \pi a^2 \quad \text{Eq. 18}$$

$$\pi a_0^2 x_0 = \pi a^2 \lambda x^0 \quad \text{Eq. 19}$$

$$a_0^2 = a^2 \lambda \quad \text{Eq. 20}$$

$$a^2 = \lambda^{-1} a_0^2 \quad \text{Eq. 21}$$

$$a = \lambda^{-1/2} a^0 \quad \text{Eq. 22}$$

Volume of Each Ring Itself is Conserved $$\text{Volume}_0 = \text{Volume}(\lambda) \quad \text{Eq. 23}$$

$$\text{Volume}_0 = \pi(b_0^2-a_0^2)x_0 \quad \text{Eq. 24}$$

$$\text{Volume}(\lambda) = \pi(b^2-a^2)\lambda x_0 \quad \text{Eq. 25}$$

$$\pi(b_0^2-a_0^2)x_0 = \pi(b^2-a^2)\lambda_x \quad \text{Eq. 26}$$

$$(b_0^2-a_0^2) = (b^2-a^2)+\lambda \quad \text{Eq. 27}$$

$$b^2 = \lambda^{-1}(b_0^2-a_0^2)+a^2 \quad \text{Eq. 28}$$

$$b = (\lambda^{-1}(b_0^2-a_0^2)+a^2)^{1/2} \quad \text{Eq. 29}$$

Using the results from Eq. 22, this can be simplified further:

$$b = (\lambda^{-1}(b_0^2-a_0^2)+a^2)^{1/2} \quad \text{Eq. 30}$$

$$b = (\lambda^{-1}(b_0^2-a_0^2)+(\lambda^{-1/2}a_0)^2) \quad \text{Eq. 31}$$

$$b = (\lambda^{-1}(b_0^2-a_0^2)+\lambda^{-1}a_0^2)^{1/2} \quad \text{Eq. 32}$$

$$b=(\lambda^{-1}(b_0^2-a_0^2+a_0^2))^{1/2} \qquad \text{Eq. 33}$$

$$b=(\lambda^{-1}b_0^2)^{1/2} \qquad \text{Eq. 34}$$

$$b=\lambda^{-1/2}b_0 \qquad \text{Eq. 35}$$

Capacitance of the Annular Capacitor

Initially the capacitance is:

$$C_0 = \frac{2\pi\varepsilon\varepsilon_0 x_0}{\ln\left(\frac{b_0}{a_0}\right)} \qquad \text{Eq. 36}$$

After it has been stretched it becomes longer, so that the length becomes ($\lambda x_0$) and the radii (a and b) are no longer the initial radii ($a_0$ and $b_0$):

$$C(\lambda) = \frac{2\pi\varepsilon\varepsilon_0 x_0 \lambda}{\ln\left(\frac{b}{a}\right)} \qquad \text{Eq. 37}$$

Substituting results from Equations 22 and 35 allows the stretched capacitance to be expressed in terms of initial geometry.

$$C(\lambda) = \frac{2\pi\varepsilon\varepsilon_0 x_0 \lambda}{\ln\left(\frac{b}{a}\right)} \qquad \text{Eq. 38}$$

$$C(\lambda) = \frac{2\pi\varepsilon\varepsilon_0 x_0 \lambda}{\ln\left(\frac{\lambda^{-1/2}b_0}{\lambda^{-1/2}a_0}\right)} \qquad \text{Eq. 39}$$

$$C(\lambda) = \frac{2\pi\varepsilon\varepsilon_0 x_0}{\ln\left(\frac{b_0}{a_0}\right)}\lambda \qquad \text{Eq. 40}$$

Capacitance is expected to vary linearly with the stretch ratio. To get the force each ring provides note that electrostatic force depends on the change in capacitance with excursion from rest.

$$F_{elec} = V^2 \frac{\partial C}{\partial x} \qquad \text{Eq. 41}$$

Note that the stretch ratio can be expressed in terms of that excursion from rest.

$$\lambda = 1 + \frac{x}{x_0} \qquad \text{Eq. 42}$$

$$C(x) = \frac{2\pi\varepsilon\varepsilon_0 x_0 \lambda}{\ln\left(\frac{b_0}{a_0}\right)}\left(1 + \frac{x}{x_0}\right) \qquad \text{Eq. 43}$$

The derivative cancels out the initial length of the actuator ($x_0$). This means that the electric force will not be predicted to change as the length of the actuator changes.

$$\frac{\partial C}{\partial x} = \frac{2\pi\varepsilon\varepsilon_0 x_0}{x_0 \ln\left(\frac{b_0}{a_0}\right)} \qquad \text{Eq. 44}$$

$$\frac{\partial C}{\partial x} = \frac{2\pi\varepsilon\varepsilon_0}{\ln\left(\frac{b_0}{a_0}\right)} \qquad \text{Eq. 45}$$

$$F_{elec} = (1/2)V^2 \frac{\partial C}{\partial x} = \frac{V^2 \pi\varepsilon\varepsilon_0}{\ln\left(\frac{b_0}{a_0}\right)} \qquad \text{Eq. 46}$$

Note that the outer radius $b_0$ is just the inner radius ($a_0$) plus the thickness of the film ($t_0$).

$$F_{elec} = (1/2)V^2 \frac{\partial C}{\partial x} = \frac{V^2 \pi\varepsilon\varepsilon_0}{\ln\left(\frac{a_0+t}{a_0}\right)} \qquad \text{Eq. 47}$$

To get the total force we must sum up the contributions of all N of the rings. Note that each ring has an outer radius that is one thickness greater than the inner radius.

$$F_{total} = V^2 \pi\varepsilon\varepsilon_0 \sum_{n=1}^{N} \left(\ln\left(\frac{(n+1)t_0}{nt_0}\right)\right)^{-1} \qquad \text{Eq. 48}$$

Canceling like terms $$F_{total} = V^2 \pi\varepsilon\varepsilon_0 \sum_{n=1}^{N} \left(\ln\left(\frac{(n+1)}{n}\right)\right)^{-1} \qquad \text{Eq. 49}$$

$$F_{total} = V^2 \pi\varepsilon\varepsilon_0 \sum_{n=1}^{N} (\ln(n+1) - \ln(n))^{-1} \qquad \text{Eq. 50}$$

The thickness of a layer has not, in fact, disappeared. It appears in the upper limit of the series (N). The total number of layers (N) can be expressed simply in terms of the initial geometry.

$$F_{total} = V^2 \pi\varepsilon\varepsilon_0 \sum_{n=1}^{N} (\ln(n+1) - \ln(n))^{-1}, \text{ where } N = \left(\frac{y_0}{t_0 \pi}\right)^{1/2} \qquad \text{Eq. 51}$$

The expected capacitance change is the force expression (Eq. 51) without the Voltage term $\frac{1}{2}V^2$:

$$\frac{\partial C}{\partial x} = 2\pi\varepsilon\varepsilon_0 \sum_{n=1}^{N} (\ln(n+1) - \ln(n))^{-1}, \text{ where } N = \left(\frac{y_0}{t_0 \pi}\right)^{1/2} \qquad \text{Eq. 52}$$

Both of the above are measurable. A candidate example geometry includes 48.8603 rings or approximately 49 rings. Accordingly, for approximately 49 rings, a predicted force and capacitance change rate is:

$$F_{elec} = \pi\varepsilon\varepsilon_0 V^2 \sum_{n=1}^{N} (\ln(n+1) - \ln(n))^{-1}$$ Eq. 53

$$F_{elec} = \pi[2.85][8.854E-12\ F/m][1200\ V]^2 \sum_{n=1}^{49} (\ln(n+1) - \ln(n))^{-1}$$ Eq. 54

$$\frac{\partial C}{\partial x} = \pi[2.85][8.854E-12\ F/m] \sum_{n=1}^{49} (\ln(n+1) - \ln(n))^{-1}$$ Eq. 55

Figure 21:
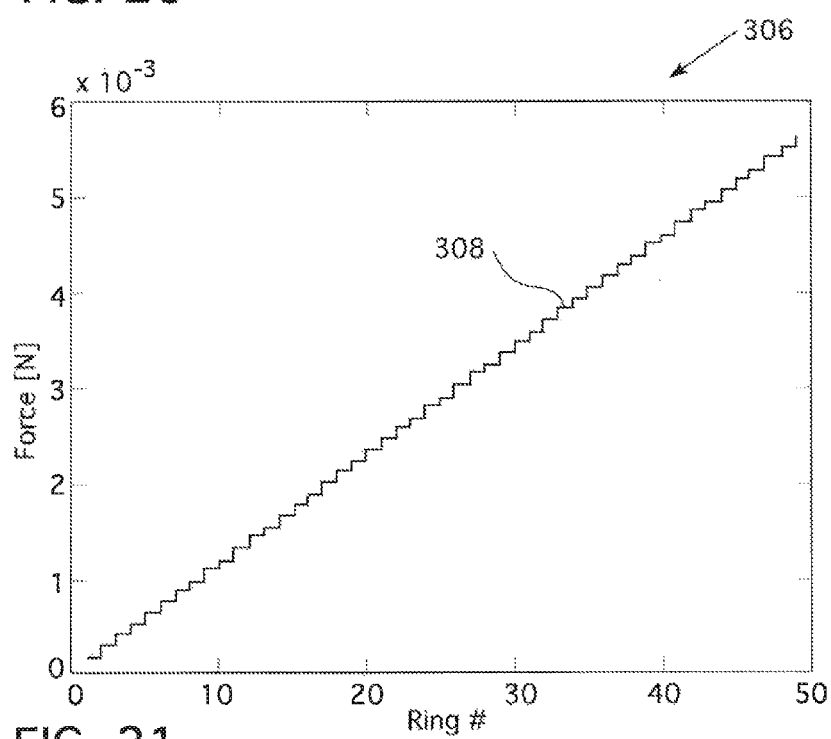
FIG. 21 is a graphical illustration depicting force provided by each additional ring in a solid dielectric elastomer transducer roll in accordance with one embodiment of the present invention.

FIG. 21 is a graphical illustration 306 depicting force 308 provided by each additional ring in a solid dielectric elastomer transducer roll in accordance with one embodiment of the present invention. Force [N] is shown along the vertical axis and ring number is shown along the horizontal axis. Accordingly, the additional force 308 provided by each ring grows linearly with the ring number. This is in conformity with expectations, as the area of each ring scales linearly with circumference. The total force of 0.1426 N approximately matches the total force for a model based on simpler assumptions: i.e., dielectric stacked, not rolled, (Eq. 56).

The calculation for parallel layers, not rolled up provides:

$$F_{elec} = (1/2)V^2 \frac{\partial C}{\partial x} = (1/2)\frac{V^2 \varepsilon\varepsilon_0 y_i}{z_i}$$ Eq. 56

Accordingly, the model provides a measurable prediction for capacitance change:

$dC/dx = F_{tot}/(0.5*(1200^2)) = 1.9806e-007 [F/m]$

Figure 22:
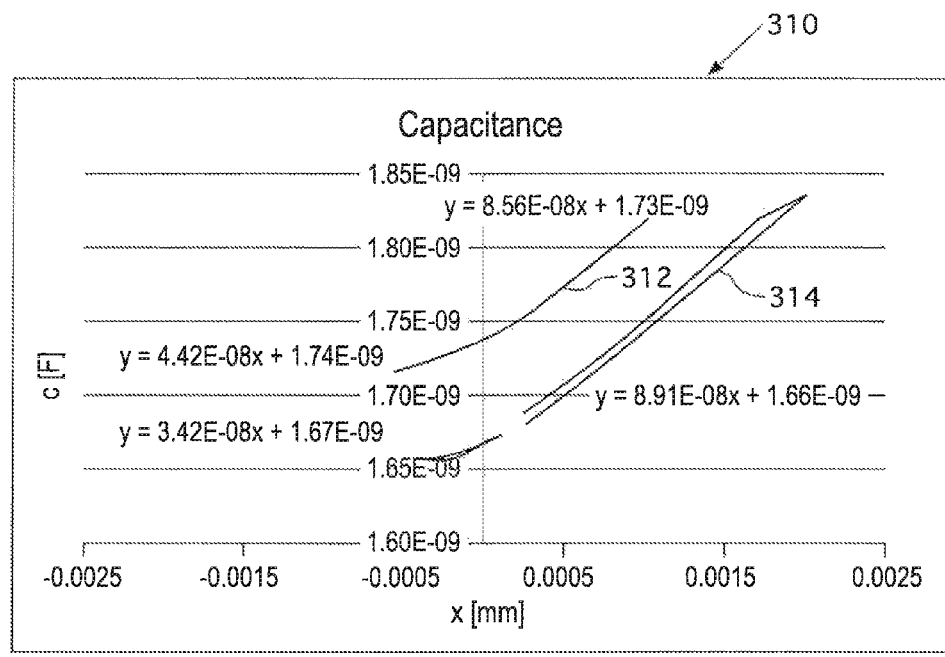
FIG. 22 is a graphical illustration depicting capacitance change versus axial displacement of a solid dielectric elastomer transducer roll in accordance with one embodiment of the present invention.

FIG. 22 is a graphical illustration 310 depicting capacitance change versus axial displacement of a solid dielectric elastomer transducer roll in accordance with one embodiment of the present invention. Capacitance C[F] is shown along the vertical axis and axial displacement x[mm] is shown along the horizontal axis. The data substantially agrees with the model. In the graphical illustration 310 capacitance change in two solid dielectric elastomer transducer rolls with 10 mm active length are depicted by curves 312 and 14 mm total length are depicted by curves 314. A peak dC/dx of 8.91E-8 F/m was observed when the transducer rolls were in tension. Although this is just (8.9E-8/1.9806E-7)=44% of the expected dC/dx, the active area did not really experience all of the displacement. Some of the displacement was taken up by deformation in the passive 4 mm of the solid dielectric elastomer transducer roll. To estimate the effect that this compliance will have on measured dC/dx, two cases may be considered (1) negligible electrode stiffness and (2) a relatively large electrode stiffness, for example equal to the film stiffness.

Case 1—Electrode Nealigible

Assuming that the active and passive areas have equal stiffness (that is, electrode is negligible), then the observed dC/dx is scaled by (total:active=14 mm:10 mm). The observed dC/dx is then (14/10)*([8.9E-8 F/m]/[1.9806E-7 F/m])=63% of expected.

Case 2—Electrode Stiff

If the stiffness of the electrode is not negligible, then it must be taken into account. In planar devices, it may be observed that a standard electrode coating on two sides of a film increases pseudo-DC stiffness of a film by an amount equivalent to multiplying Young's modulus of the film by two. The roll is comprised of two compliances in series. The active Area is 10 mm long and has two layers of electrode, and the passive 4 mm long and has one layer.

$s1 = 0.010\ m/(2*Y\_film*Area)$ $s2 = 0.004\ m/(1.5*Y\_film*Area)$

And the proportion of deformation occurring in the active area is $\Delta x_1/\Delta x_{tot} = (5/(5+2.6667)) = 0.6522$.

Scaling by this factor, dC/dx is found to be ((1/0.6522)*[8.9E-8 F/m])/[1.98E-7 F/m]=69% of expected. In the absence of control data measuring electrode stiffness directly, this provides the best estimate of how the observed capacitance change relates to the nested ring model.

Figure 23:
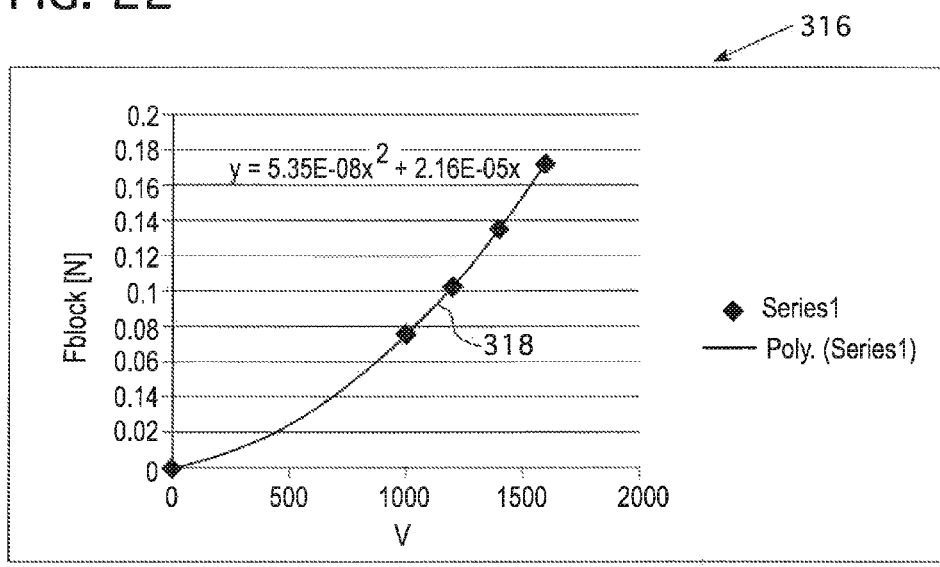
FIG. 23 is a graphical illustration depicting blocked force versus applied voltage response of a solid dielectric elastomer transducer roll in accordance with one embodiment of the present invention.

FIG. 23 is a graphical illustration 316 depicting blocked force versus applied voltage response 318 of a solid dielectric elastomer transducer roll in accordance with one embodiment of the present invention. The response 318 was obtained by measuring a sample on an INSTRON instrument for measuring tension/compression, made by INSTRON of Norwood, Mass., at 1200V and a blocked force at 1200V of 0.102N was observed, as shown in FIG. 23. The blocked force measurement is ([0.102 N]/[0.1363 N])=74% of the model prediction.

Figure 24:
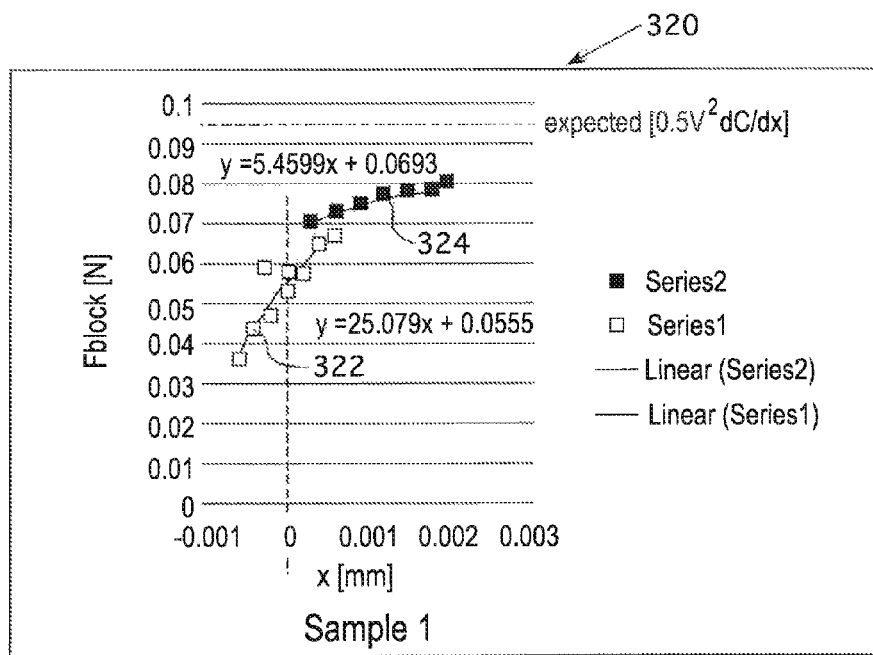
FIG. 24 is a graphical illustration depicting blocked force versus axial displacement showing the difference between the solid dielectric elastomer transducer roll in compression versus tension in accordance with one embodiment of the present invention.

FIG. 24 is a graphical illustration 320 depicting blocked force versus axial displacement demonstrating the difference between the solid dielectric elastomer transducer roll in compression versus tension in accordance with one embodiment of the present invention. Measuring blocked force on the INSTRON instrument, shows a clear difference between using the solid dielectric elastomer transducer roll in compression 322 versus tension 324, consistent with the slope differences observed in dC/dx. In compression, layers of the solid dielectric elastomer transducer roll undergo localized buckling rather than uniform compression. This occurs at forces (0.1 N) lower than the Euler buckling limit for the entire column (1.5N calculated, 1.4 N observed).

Figure 25:
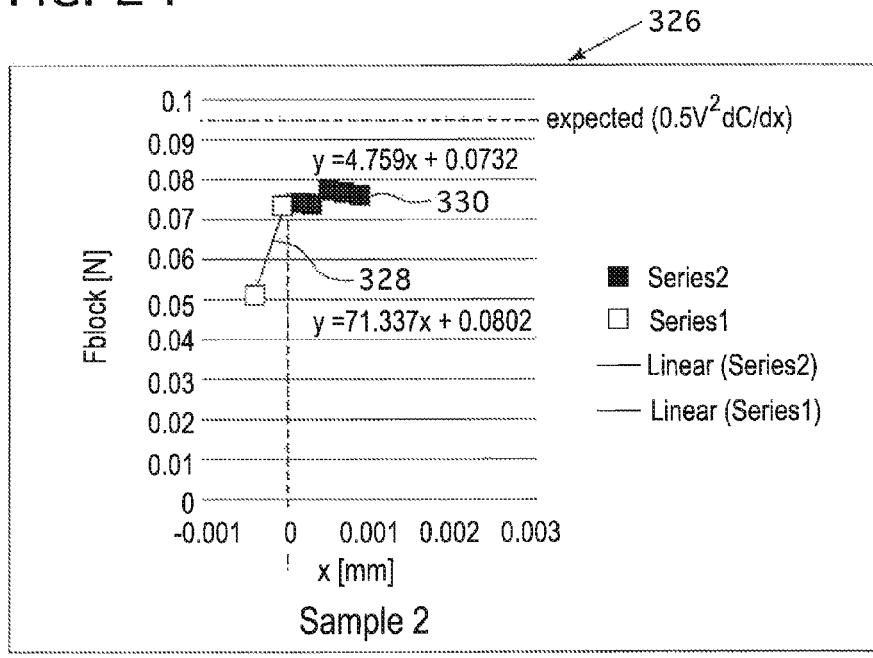
FIG. 25 is a graphical illustration of blocked force versus longitudinal displacement showing the difference between the solid dielectric elastomer transducer roll in compression versus tension in accordance with one embodiment of the present invention.

FIG. 25 is a graphical illustration 326 of blocked force versus longitudinal displacement showing the difference between the solid dielectric elastomer transducer roll in compression 328 versus tension 330 in accordance with one embodiment of the present invention.

Figure 26:
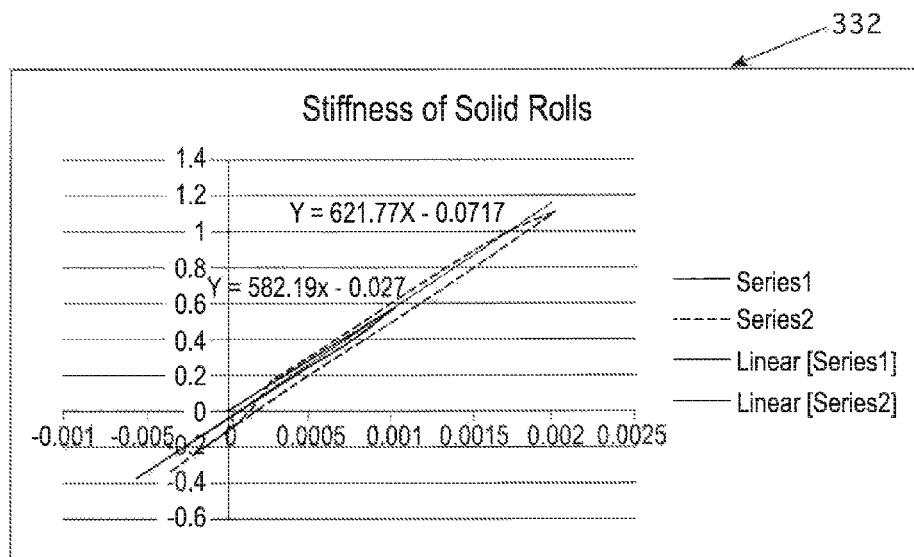
FIG. 26 is a graphical representation of stiffness of solid dielectric elastomer transducer rolls in accordance with one embodiment of the present invention.

FIG. 26 is a graphical representation 332 of stiffness of solid dielectric elastomer transducer rolls in accordance with one embodiment of the present invention. The simplest prediction of stiffness for the solid rolls is to neglect electrode stiffness and the rigid boundary conditions:

$k_{simple} = YA/l = [0.6E6\ Pa]*([2*160E-3\ m]*[40E-6\ m])/[14E-3\ m] = 548.6\ N/m$.

This estimate of the stiffness is relatively good. Observed stiffness is higher than theoretical by only 6-13% in these two samples.

[582 N/m, 621 N/m]·/[548.6 N/m]=[1.06 1.13]

This suggests that the effect of the electrode on the stiffness of the solid dielectric elastomer transducer rolls is relatively small and not the 2× factor in the active area that was considered in the dC/dx calculation above. It appears a better assumption may be to treat the electrode stiffness as negligible and to estimate that the observed dC/dx is about 63% of that expected by the model.

Figure 27:
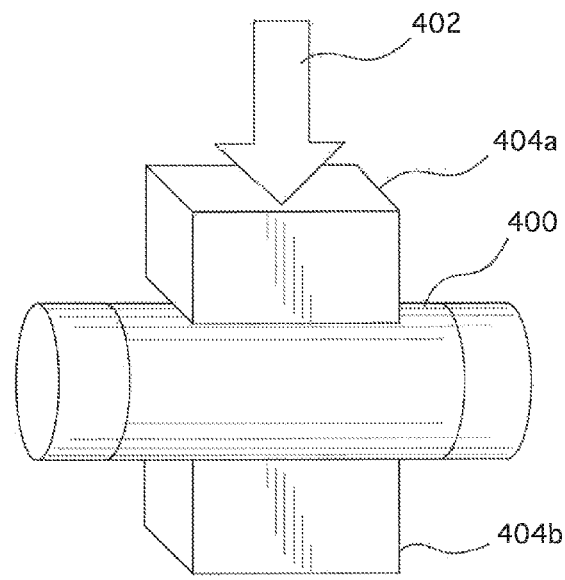
FIG. 27 illustrates a solid dielectric elastomer transducer roll in flat roll mode where the roll is placed under compression in a radial direction rather than in an axial direction in accordance with one embodiment of the present invention.

FIG. 27 illustrates a solid dielectric elastomer transducer roll 400 in flat roll mode where the roll 400 is placed under compression 402 in a radial direction rather than in an axial direction in accordance with one embodiment of the present invention. As shown, a portion of the solid dielectric elastomer transducer roll 400 is clamped between jaws 404a, 404b such that is compresses the transducer roll 400 radially rather axially. Experimental results indicate that the peak capacitance change dC/dx in radial ("flat roll") mode is approximately 5-times the capacitance change dC/dx in axial mode.

Figure 28:
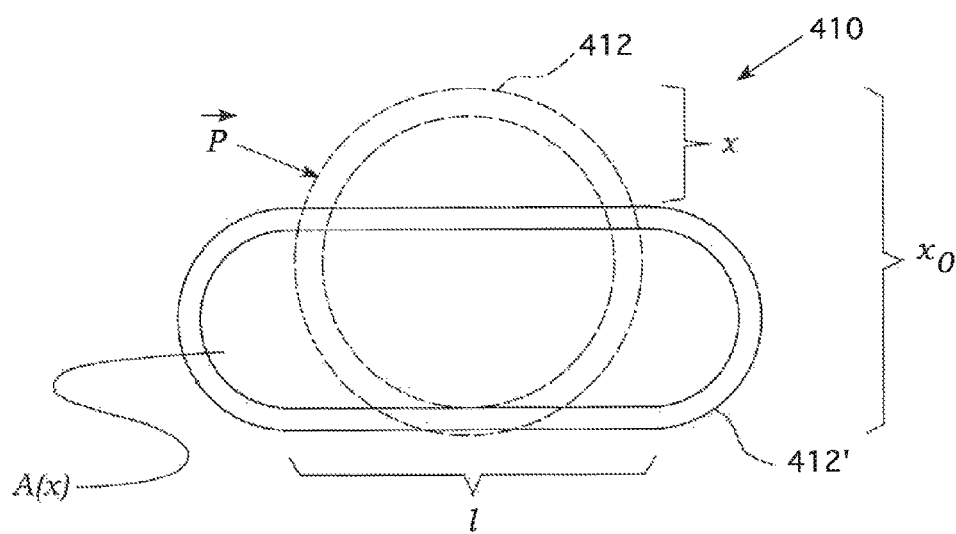
FIG. 28 illustrates a geometric model of a solid dielectric elastomer transducer roll in flat roll mode where the roll is placed under compression in a radial direction in accordance with one embodiment of the present invention.

FIG. 28 illustrates a geometric model 410 of a solid dielectric elastomer transducer roll 412 in radial ("flat roll") mode where the roll 412 is placed under compression in a radial direction in accordance with one embodiment of the present invention. The cross-sectional area of the uncompressed roll 412 is depicted as a circle in phantom, whereas the cross-sectional area A(x) of the roll 412' under radial compression is depicted in solid line as a flattened elongated structure with flat regions in the center over a length l and rounded ends. The model assumes the following:

Long out of plane→Plane strain;
Incompressible→A(x)=A$_0$; and
Flat regions slip→Equal strain around perimeter.

The geometric model for the solid dielectric elastomer transducer roll 412 in radial mode ("flat roll") is described by the following equations:

$$P_0 = \pi x_0 \quad \text{Eq. 57}$$

$$P(x) = 2\ell + \pi(x_0 - x) \quad \text{Eq. 58}$$

$$A_0 = \frac{\pi}{4}x_0^2 \quad \text{Eq. 59}$$

$$A(x) = \ell(x_0 - x) + \frac{\pi}{4}(x_0 - x)^2 \quad \text{Eq. 60}$$

$$A_0 = A(x) \quad \text{Eq. 61}$$

$$\frac{\pi}{4}x_0^2 = \ell(x_0 - x) + \frac{\pi}{4}(x_0 - x)^2 \quad \text{Eq. 62}$$

$$\ell = \frac{\pi(x_0^2 - (x_0 - x)^2)}{4(x_0 - x)} \quad \text{Eq. 63}$$

$$P(x) = 2\ell + \pi(x_0 - x) \quad \text{Eq. 64}$$

$$\lambda_P(x) = \frac{P(x)}{P_0} = \frac{P(x)}{\pi x_0} \quad \text{Eq. 65}$$

$$C = C_0 \lambda_P^2 \quad \text{Eq. 66}$$

Figure 29:
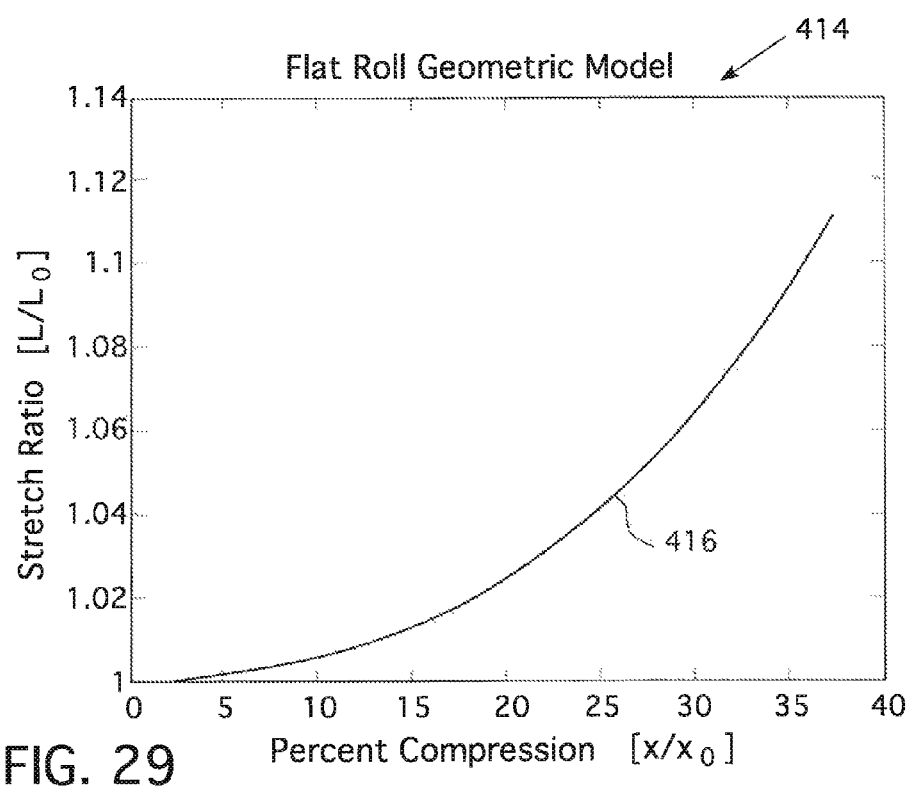
FIG. 29 is a graphical illustration depicting stretch ratio versus percent compression in a radial direction of a solid dielectric elastomer transducer roll in accordance with one embodiment of the present invention.

FIG. 29 is a graphical illustration 414 depicting stretch ratio versus percent compression in a radial direction of a solid dielectric elastomer transducer roll in accordance with one embodiment of the present invention. Stretch ration [L/L$_0$] is shown along the vertical axis and percent compression [x/x$_0$] is shown along the horizontal axis. The curve 416 shows non-linear behavior of stretch ration versus percent compression.

Figure 30:
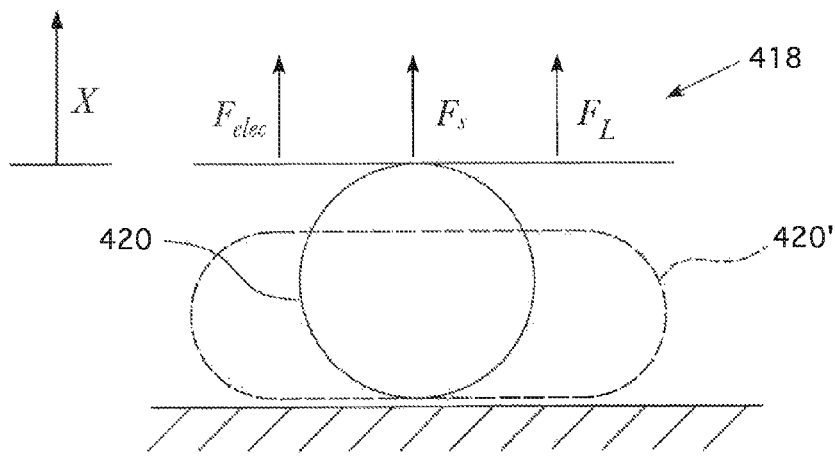
FIG. 30 illustrates a static equilibrium diagram of a solid dielectric elastomer transducer roll in flat roll mode under static load in accordance with one embodiment of the present invention.

FIG. 30 illustrates a static equilibrium diagram 418 of a solid dielectric elastomer transducer roll 420 in radial compression ("flat roll") mode under static load in accordance with one embodiment of the present invention. Static equilibrium is defined as follows:

$$F_{elec} + F_S + F_L = 0 \quad \text{Eq. 67}$$

where $F_{elec}$ is electric force, $F_S$ is spring force and $F_L$ is an external load. The electric force is proportional to the capacitance change dC/dx which is in turn proportional to the stretch ratio of the dielectric layers λ=P/P$_0$. Because this stretch is approximately quadratic with respect to compression of the roll, (FIGS. 29 and 31), the electric force, which is the slope of the capacitance curve, can be approximated with a single constant such that dC/dx=k$_1$x. The spring force is also approximated well with a single term such that $F_s = k_3 x^2$ $$\frac{1}{2}V^2(k_1 x) + k_3 x^2 + F_L = 0 \quad \text{Eq. 68}$$

$$k_1 V^2/2x + k_3 x^2 + F_L = 0 \quad \text{Eq. 69}$$

$$k_3 x^2 + (\frac{1}{2}k_1 V^2)x + F_L = 0 \quad \text{Eq. 70}$$

The equilibrium displacement of the roll subjected to the static load is found from the roots of the quadratic equation, where a=k$_3$, b=½k$_1$V$^2$ and c=F$_L$.

$$x = [-b \pm \sqrt{(b^2 - 4ac)}]/2a \quad \text{Eq. 71}$$

The Pseudo-DC Roll Model.

$$F_{elec} = \frac{1}{2}V^2 dC/dx \quad \text{Eq. 72}$$

$$F_{elec} = \frac{1}{2}V^2(k_1 x) \quad \text{Eq. 73}$$

$$F_S = k_3 x^2 \quad \text{Eq. 74}$$

$F_L = -4$, [N], for example.

Figure 31:
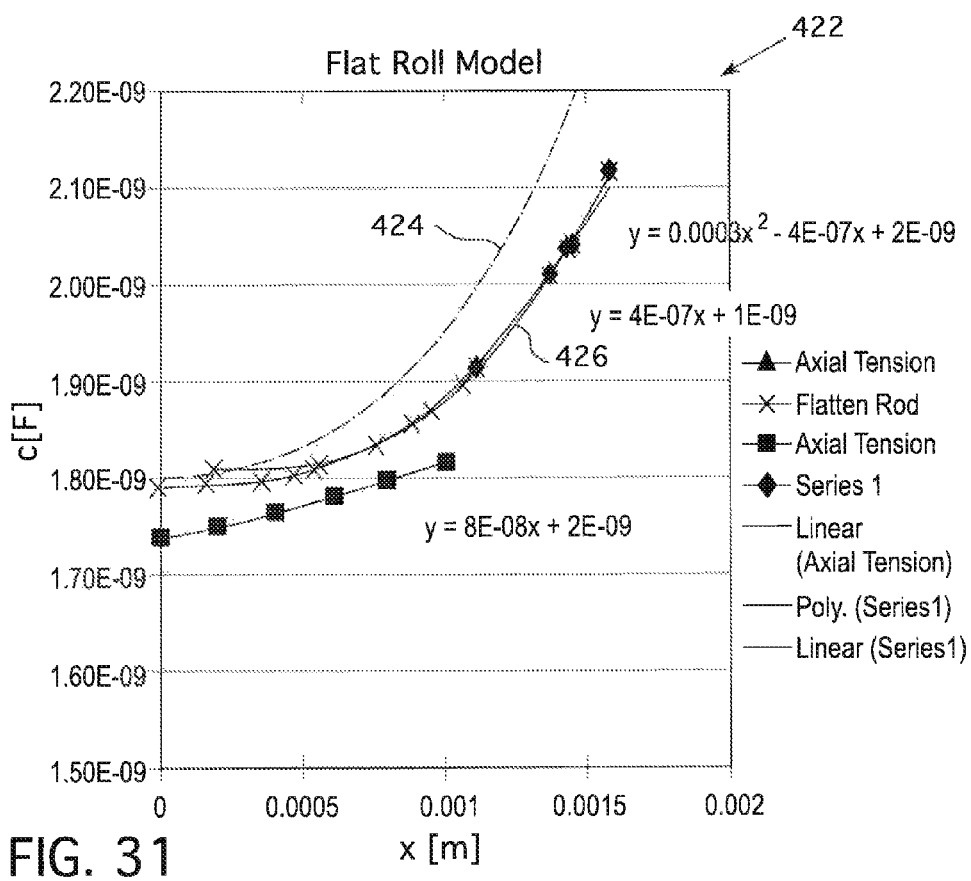
FIG. 31 is a graphical illustration depicting capacitance versus compression in a radial direction of a solid dielectric elastomer transducer roll in flat roll mode in accordance with one embodiment of the present invention.

FIG. 31 is a graphical illustration 422 depicting capacitance versus compression in a radial direction of a solid dielectric elastomer transducer roll in flat roll mode in accordance with one embodiment of the present invention. Capacitance C[F] is shown along the vertical axis and compression x[m] is shown along the horizontal axis. The flat roll model curve 424 provides a reasonable first approximation of the capacitance change versus compression as compared to the measurements results 426. Potential contributors to the difference between actual measurements 426 and the model 424 may be that just 7.5 mm of 10 mm active length was compressed in an INSTRON test instrument and the rigid boundary may limit extension of the outer layers.

Figures 32A, 32B, 32C, 32D:
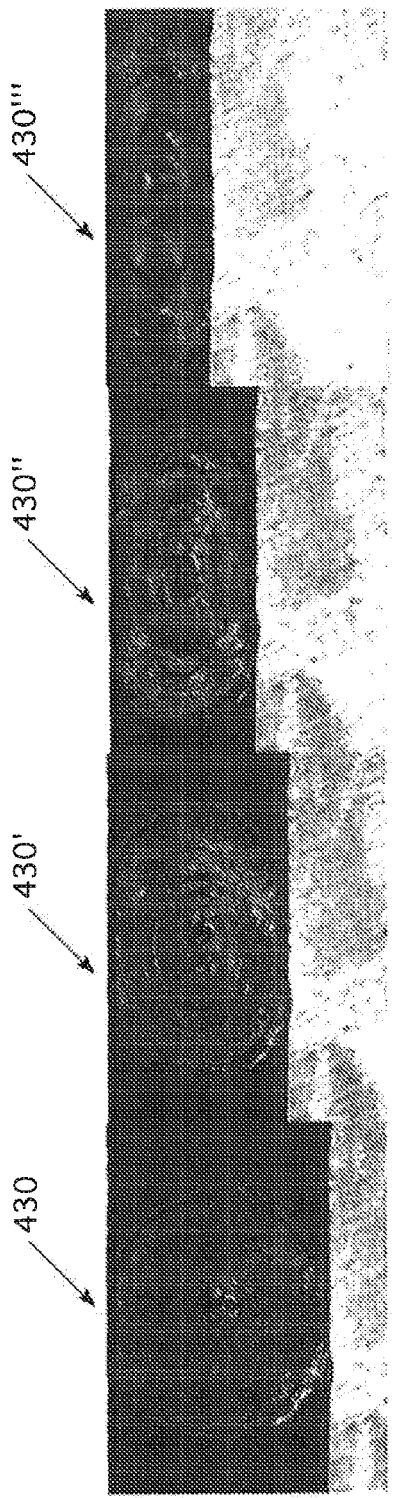
FIGS. 32A, 32B, 32C and 32D illustrate a solid dielectric elastomer transducer roll under increasing compression force in a radial direction in accordance with one embodiment of the present invention.

FIGS. 32A, 32B, 32C and 32D illustrate a solid dielectric elastomer transducer roll 430 under increasing compression force in a radial direction in accordance with one embodiment of the present invention. From left to right, the solid dielectric elastomer transducer roll 430 undergoes increasing compression force such that the roll 430 in under no compression force, roll 430' is under greater compression force than the roll 430, roll 430" is under greater compression force than the roll 430', and the roll 430'" is under greater compression force than the roll 430". As shown in FIGS. 32B, 32C and 32D, the roll begins to delaminate as it is subjected to increasing greater compression forces. This delamination causes deviation from the model, and presents a practical limit on compression of the roll.

Figures 33, 34:
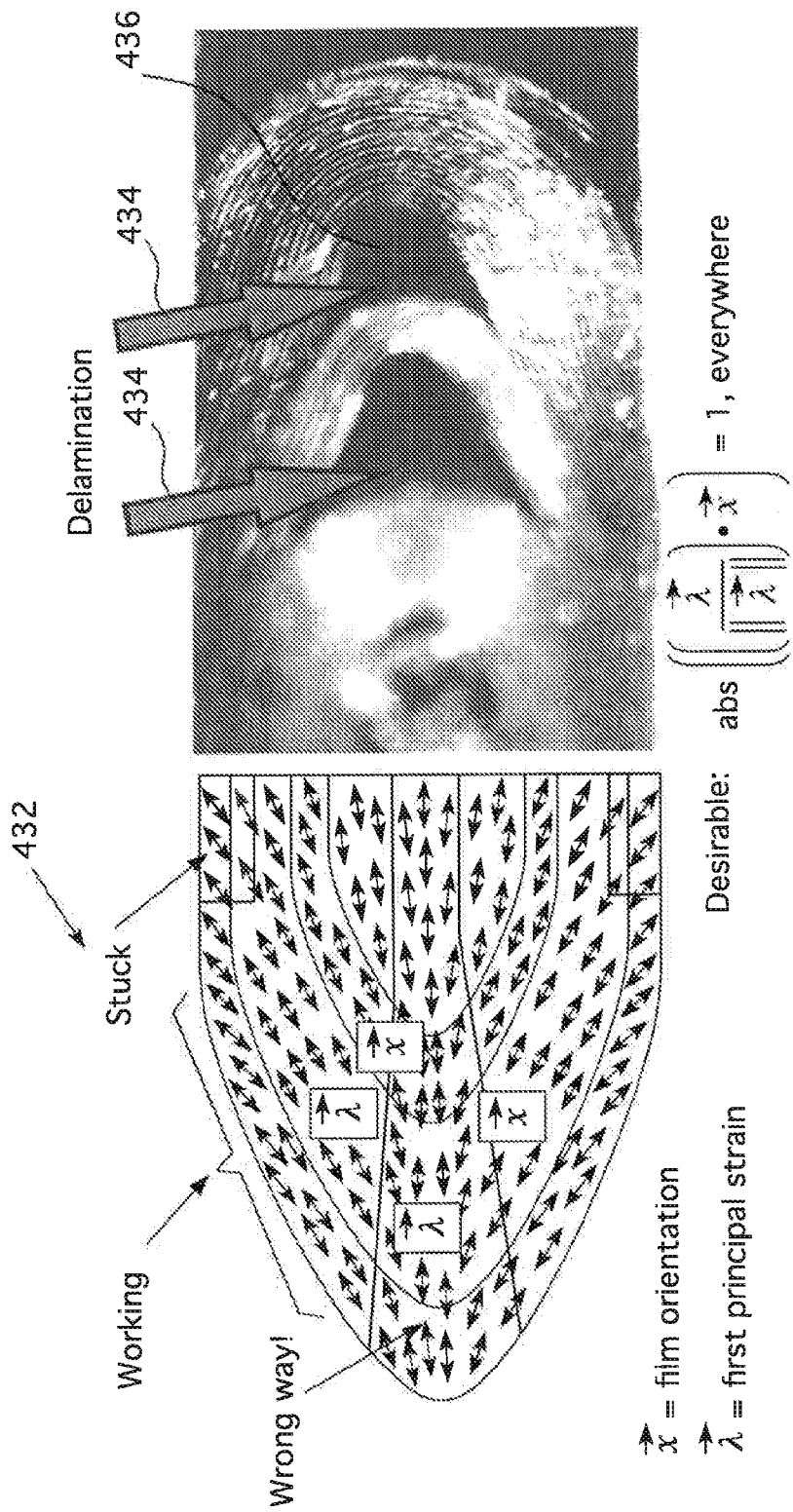
FIG. 33 illustrates a finite element analysis model of a solid dielectric elastomer transducer roll undergoing radial compression in accordance with one embodiment of the present invention.
FIG. 34 illustrates the delamination of a solid dielectric elastomer transducer roll undergoing radial compression in accordance with one embodiment of the present invention.

FIG. 33 illustrates a finite element analysis model 432 of a solid dielectric elastomer transducer roll 434 undergoing radial compression in accordance with one embodiment of the present invention and indicates where stretch orientation is and is not well-aligned with the orientation of the layers.

FIG. 34 illustrates the delamination of inner layers 434 of a solid dielectric elastomer transducer roll 436 undergoing radial compression in accordance with one embodiment of the present invention. As the finite element analysis predicts, delamination occurs in regions where the principal stretch is oriented through the thickness of dielectric films.

Figure 35:
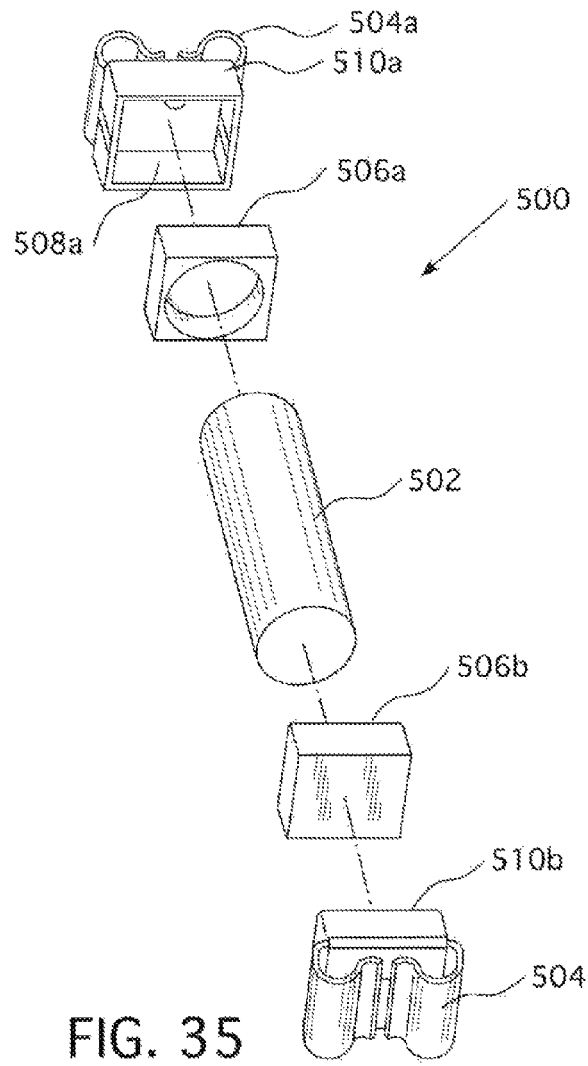
FIG. 35 illustrates an exploded view of a quick-connect solid dielectric elastomer transducer roll in accordance with one embodiment of the present invention.

FIG. 35 illustrates an exploded view of a quick-connect solid dielectric elastomer transducer roll 500 in accordance with one embodiment of the present invention. The quick-connect solid dielectric elastomer transducer roll 500 comprises a solid dielectric elastomer transducer roll 502 and first and second electrical quick-connect terminals 504a, 504b. The first quick-connect terminal 504a is attached to one end of the solid dielectric elastomer transducer roll 502 by electrically conductive adhesive 506a. The second quick-connect terminal 504b is attached to another end of the solid dielectric elastomer transducer roll 502 by electrically conductive adhesive 506b. The electrically conductive adhesive 506a is received in a cavity 508a defined in a cap 510a portion of the quick-connect terminal 504a. The end of the solid dielectric elastomer transducer roll 502 is then inserted into the cavity 508a filled with the conductive adhesive 506a. Although not shown in this view, the second quick-connect terminal 504b also comprises a cap portion 510b defining cavity for receiving the conductive adhesive 506b and the other end of the solid dielectric elastomer transducer roll 502. Although the first and second electrical quick-connect terminals 504a, 504b are shown to be female quick-connect terminals, in other embodiments, they may be male or combinations thereof.

Figure 36:
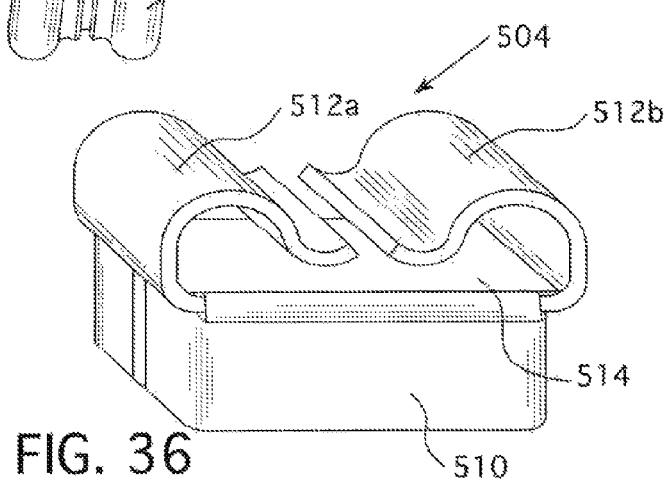
FIG. 36 is a detail view of an electrical quick-connect terminal shown in FIG. 35 in accordance with one embodiment of the present invention.

FIG. 36 is a detail view of an electrical quick-connect terminal 504 shown in FIG. 35 in accordance with one embodiment of the present invention. The quick-connect terminal 504 comprises first and second cantilever springs 512a, 512b defining a space 514 for slidably receiving a conductive male pin (tab, blade) connector, as described in more detail in FIG. 37. A cap 510 portion of the quick-connect terminal 504 receives a conductive adhesive and one end of the solid dielectric elastomer transducer roll 502, as shown and described in FIG. 35.

Figure 37:
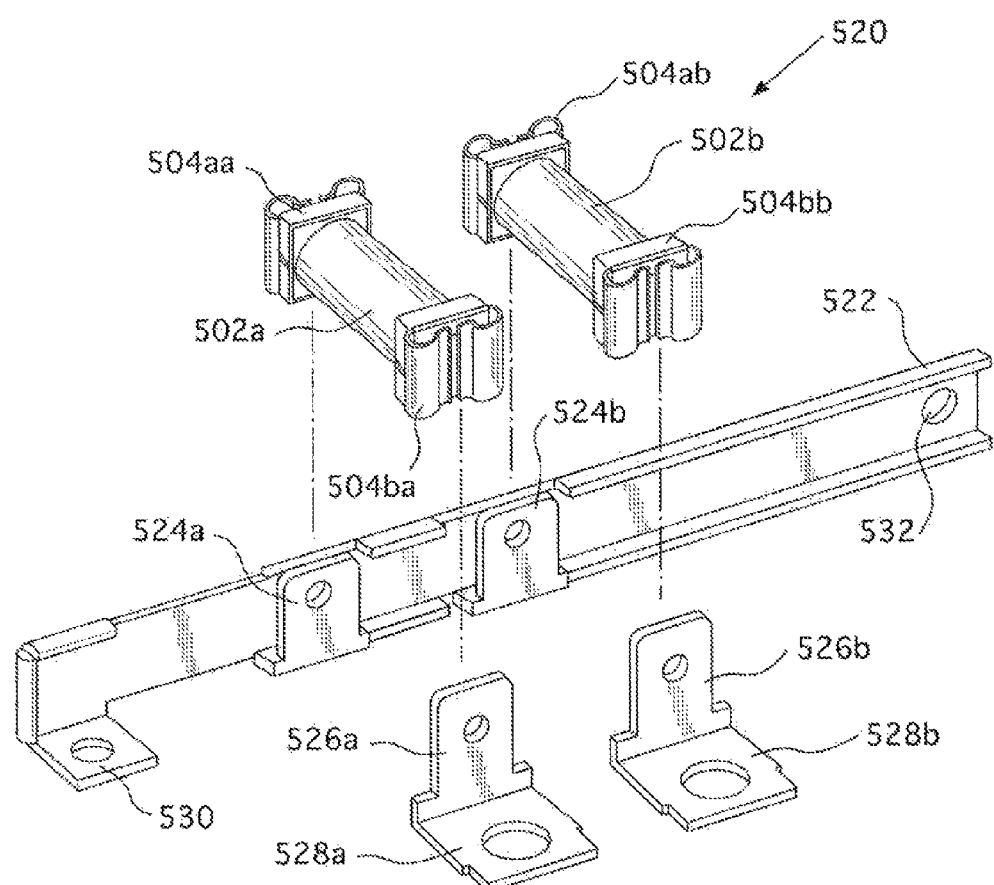
FIG. 37 illustrates a quick-connection system for quick-connecting solid dielectric elastomer transducer rolls to a substrate, such as a printed circuit board, and conductive flexure in accordance with one embodiment of the present invention.

FIG. 37 illustrates quick-connection system 520 for quick-connecting first and second solid dielectric elastomer transducer rolls 502a, 502b to a substrate (not shown), such as a printed circuit board, and conductive flexure 522 in accordance with one embodiment of the present invention. The first solid dielectric elastomer transducer roll 502a comprises first and second quick-connect terminals 504aa, 504ab configured to slidably receive on one end an integral male pin 524a coupled to the flexure 522 and to slidably receive on the other end a 90° male pin 526a configured to be mounted to the substrate via a base portion 528a. The second solid dielectric elastomer transducer roll 502b comprises first and second quick-connect terminals 504ab, 504bb configured to slidably receive on one end an integral male pin 524b coupled to the flexure 522 and to slidably receive on the other end a 900 male pin 526b configured to be mounted to the substrate via a base portion 528b. The flexure 522 also comprises a base portion 530 to couple the flexure 522 to the substrate and a feature 532 for mounting a load. The substrate mountable base portions 528a, 528b, 530 are compatible with soldering or may be attached to the substrate by other connection mechanisms such screws, rivets, and the like. In one embodiment, the tabs 524a, 524b, 526a, 526b may be FASTON male pin and connectors provided by AMP, Inc., for example.

Figure 38:
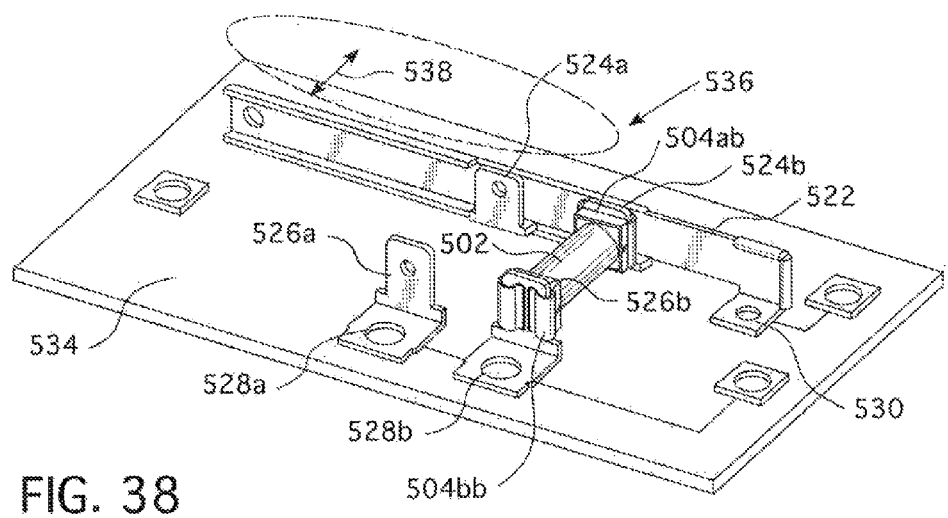
FIG. 38 illustrates a solid dielectric elastomer transducer roll with female quick-connect terminals in the context of a printed circuit board substrate in accordance with one embodiment of the present invention.

FIG. 38 illustrates a solid dielectric elastomer transducer roll 502 with female quick-connect terminals 504ab, 504bb in the context of a printed circuit board substrate 534 in accordance with one embodiment of the present invention. The female quick-connect terminals 504ab, 504bb slidably receive respective 900 tabs 524b and 526b. The base portions 528a, 528b of the respective 900 tabs 526a, 526b are soldered to the substrate 534. The flexure 522 also is soldered to the substrate 534 by base portion 530. In one embodiment, the flexure 522 is electrically coupled to drive electronics through the connection of the base portion 530 to the substrate 534. A mechanical load can be applied in the region 536 shown in broken line. One end of the solid dielectric elastomer transducer roll 502 is attached to the substrate 534 through a standard male connector 526b. The other end is attached to the custom flexure 522 that includes an integral male pin 524b cut to the same standard as the substrate mounted standard male connector 526b. The flexure 522 is able to move in direction 538 to place the solid dielectric elastomer transducer roll 502 under tension and compression as it moves back and forth. Although the substrate 534 is configured to hold two solid dielectric elastomer transducer rolls 502, one was omitted for clarity.

Figure 39:
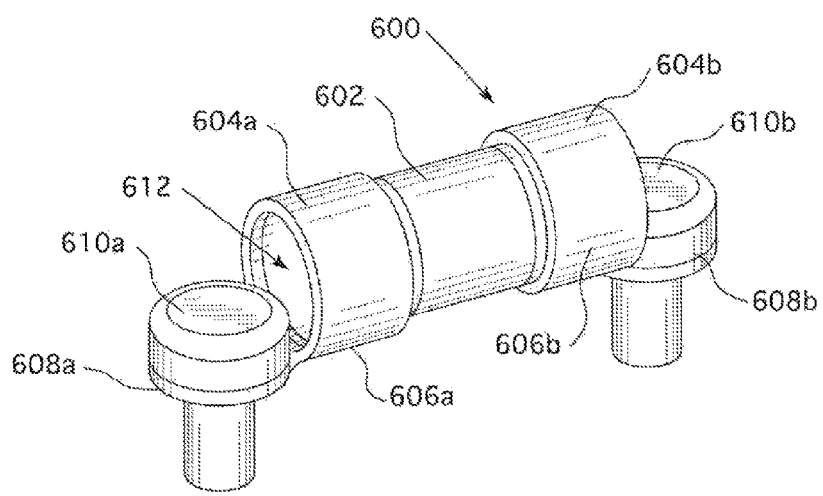
FIG. 39 illustrates a ring connect solid dielectric elastomer transducer roll in accordance with one embodiment of the present invention.

FIG. 39 illustrates a ring connect solid dielectric elastomer transducer roll 600 in accordance with one embodiment of the present invention. The ring connect solid dielectric elastomer transducer roll 600 comprises a solid dielectric elastomer transducer roll 602 and first and second ring connect terminals 604a, 604b. The ring connect terminals 604a, 604b comprise cylindrical axial portions 606a, 606b and metal rings 608a, 608b. The cylindrical axial portions 606a, 606b define cavities 612 (only one shown) to receive the ends of the solid dielectric elastomer transducer roll 602 and to simplify the application of a conductive adhesive to the ends of the solid dielectric elastomer transducer roll 602. Because this version uses screw fasteners 610a, 610b, it requires a screw driver to replace modules. As previously described in connection with FIGS. 10 and 11 exposing the end of the solid dielectric elastomer transducer roll 602 to a solvent produces a local swelling and separation of the layers that allows penetration of the conductive adhesive. After curing, the inter-digitated glue provides a robust electrical and mechanical connection between the terminals 604a, 604b and the solid dielectric elastomer transducer roll 602. It will be appreciated by those skilled in the art, that the cavities of axial portions 606a, 606b need not be cylindrical but may have other shapes to conform to the ends of the dielectric elastomer transducer including, but not limited to, oval for flattened roll transducers or rectangular for multi-layer stack transducers.

Figure 40:
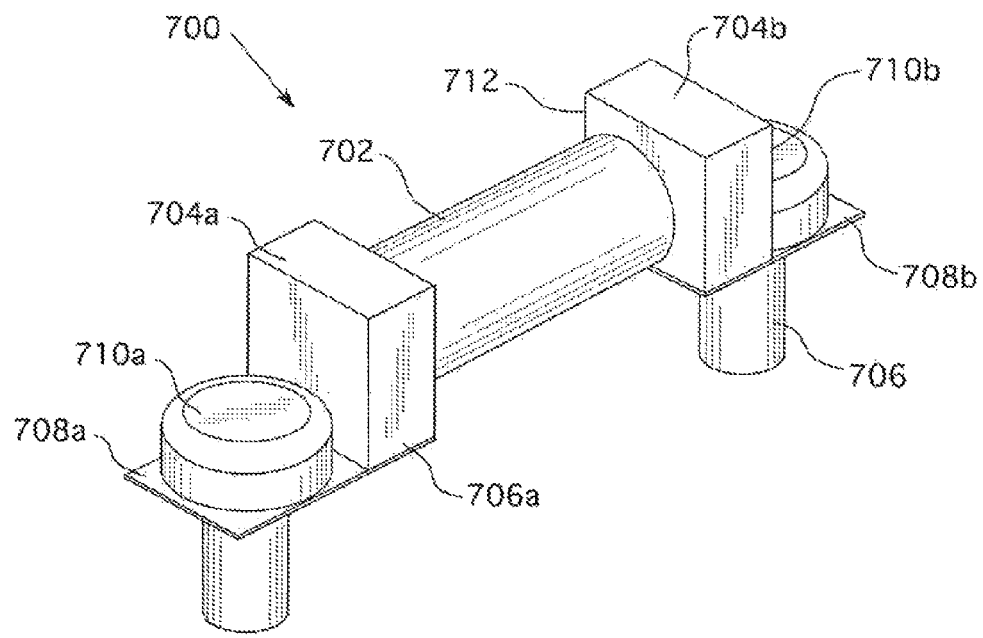
FIG. 40 illustrates an alternative ring connect solid dielectric elastomer transducer roll in accordance with one embodiment of the present invention.

FIG. 40 illustrates an alternative ring connect solid dielectric elastomer transducer roll 700 in accordance with one embodiment of the present invention. The ring connect solid dielectric elastomer transducer roll 700 comprises a solid dielectric elastomer transducer roll 702 and first and second ring connect terminals 704a, 704b. The ring connect terminals 704a, 704b comprise caps 706a, 706b and metal rings 708a, 708b. The caps 706a, 706b define cavities 712 (only one shown) to receive the ends of the solid dielectric elastomer transducer roll 702 and to simplify application of a conductive adhesive to the ends of the solid dielectric elastomer transducer roll 702. Because this version uses screw fasteners 710a, 710b, it requires a screw driver to replace modules. As previously described in connection with FIGS. 10 and 11 exposing the end of the solid dielectric elastomer transducer roll 702 to a solvent produces a local swelling and separation of the layers that allows penetration of the conductive adhesive. After curing, the inter-digitated glue provides a robust electrical and mechanical connection between the terminals 704a, 704b and the solid dielectric elastomer transducer roll 702.

Figure 41:
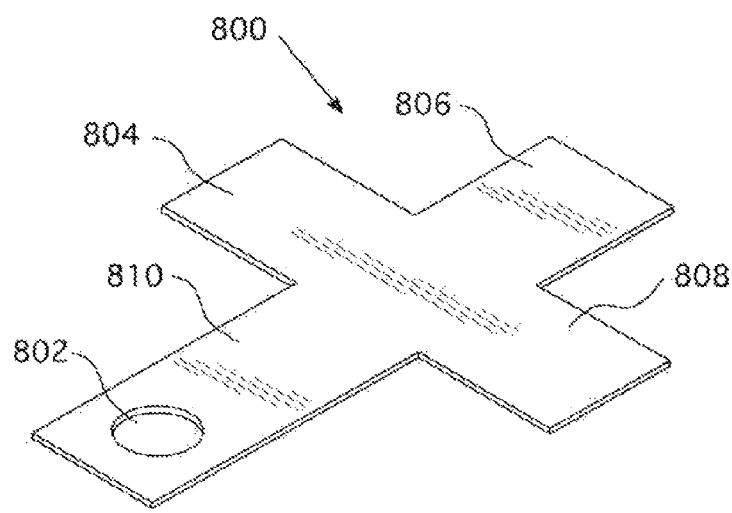
FIG. 41 illustrates a metal component for manufacturing the ring connect terminals for a solid dielectric elastomer transducer roll shown in FIG. 40 in accordance with one embodiment of the present invention.

FIG. 41 illustrates a metal component 800 for manufacturing the ring connect terminal 704a for a solid dielectric elastomer transducer roll shown in FIG. 40 in accordance with one embodiment of the present invention. The component 800 is made of metal and can be stamped, laser cut, die cut, or any other suitable technique. The component 800 comprises a ring 802 and four tabs 804, 806, 808, and 810 that are folded or bent in a predetermined manner to manufacture the ring connect terminal 704a.

FIGS. 42A-42G illustrate a process for manufacturing the ring connect terminal 704a (FIG. 40) for a solid dielectric elastomer transducer roll shown in FIG. 40 in accordance with one embodiment of the present invention.

FIG. 42A illustrates a metal sheet 820 defining apertures 822 that will serve as the ring portion of the ring connect terminal 704a (FIG. 40) for the solid dielectric elastomer transducer roll shown in FIG. 40 in accordance with one embodiment of the present invention. Several components 800 such as that shown in FIG. 41 will be made from the metal sheet 820.

FIG. 42B illustrates a metal component 824 stamped out from the metal sheet 820 shown in FIG. 42A in accordance with one embodiment of the present invention. The metal component defines an aperture 822 that will form the ring portion of the ring connect terminal 704a (FIG. 40). The cap 706a (FIG. 40) is formed by folding or bending the four tabs 826, 828, 830, and 832.

FIG. 42C illustrates a 90° up fold of the four tabs 826, 828, 830, and 832 of the metal component 824 shown in FIG. 42B in the direction indicated by the arrows in accordance with one embodiment of the present invention.

FIG. 42D illustrates a 1800 over fold of the four tabs 826, 828, 830, and 832 of the metal component 824 shown in FIG. 42C in the direction indicated by the arrows in accordance with one embodiment of the present invention.

FIG. 42E illustrates a 90° down fold of the four tabs 826, 828, 830, and 832 of the metal component 824 shown in FIG. 42D in the direction indicated by the arrows in accordance with one embodiment of the present invention;

FIG. 42F is a finished electrical ring connect terminal 704b manufactured according with the steps depicted in FIGS. 42A-E in accordance with one embodiment of the present invention;

FIG. 42G illustrates an assembled ring connect solid dielectric elastomer transducer roll 700. The ring connect solid dielectric elastomer transducer roll 700 comprises the finished ring connect terminals 704a, 704b attached to both ends of a solid dielectric elastomer transducer roll 702 with conductive adhesive to form a ring connect solid dielectric elastomer transducer roll 700 in accordance with one embodiment of the present invention. The metal rings 708a, 708b are used to receive mounting fasteners to connect the ring connect solid dielectric elastomer transducer roll 700 to a substrate.

FIG. 42H illustrates the ring connect solid dielectric elastomer transducer roll 700 shown in FIG. 42G with mounting fasteners 708a, 708b in accordance with one embodiment of the present invention. The ring connect solid dielectric elastomer transducer roll 700 shown in FIG. 42H comprises mounting screw fasteners 710a, 710b provided through the corresponding rings 708a, 708b in the finished electrical terminals 704a, 704b.

Figure 43:
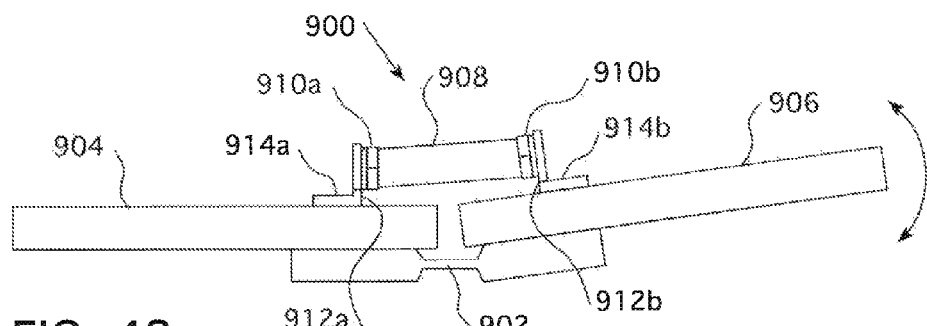
FIG. 43 illustrates a quick-connect dielectric elastomer transducer roll in combination with a living hinge coupling two substrates in accordance with one embodiment of the present invention.

FIG. 43 illustrates a quick-connect dielectric elastomer transducer roll 900 in combination with a living hinge 902 coupling two substrates 904, 906 in accordance with one embodiment of the present invention. With the quick-connect dielectric elastomer transducer roll 900 combined with the living hinge 902, the substrate, a printed circuit board, for example, serves to carry the drive electronics and also can act as an actuated lever to save space, cost, and weight. As shown in FIG. 43, the quick-connect dielectric elastomer transducer roll 900 comprises a solid dielectric elastomer transducer roll 908 with female terminals 910a, 910b connected to each end thereof with conductive adhesive. The first terminal 910a on one end of the quick-connect dielectric elastomer transducer roll 900 is connected to a 900 male pin 912a mounted to the first substrate 904 via a base portion 914a. The second terminal 910a on the other end of the quick-connect dielectric elastomer transducer roll 900 is connected to a 90° male pin 912b mounted to the second substrate 906 via a base portion 914b. The living hinge 902 flexibly couples the two substrates 904, 906. At least one of the substrates 904, 906 is movable in response to energizing the solid dielectric elastomer transducer roll 908. In FIG. 43, when the solid dielectric elastomer transducer roll 908 is energized, the rightmost substrate 906 is movable and can act as an actuated lever.

Figure 44:
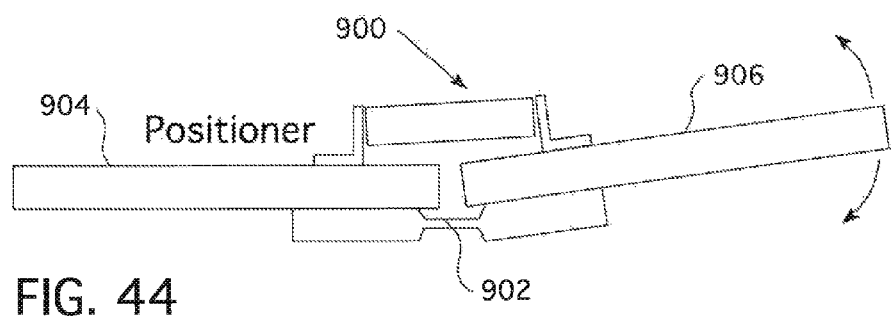
FIG. 44 illustrates the quick-connect dielectric elastomer transducer roll in combination with the living hinge coupling two substrates shown in FIG. 43 configured as a positioner in accordance with one embodiment of the present invention.

FIG. 44 illustrates the quick-connect dielectric elastomer transducer roll 900 in combination with the living hinge 902 shown in FIG. 43 coupling two substrates 904, 906 configured as a positioner in accordance with one embodiment of the present invention.

Figure 45:
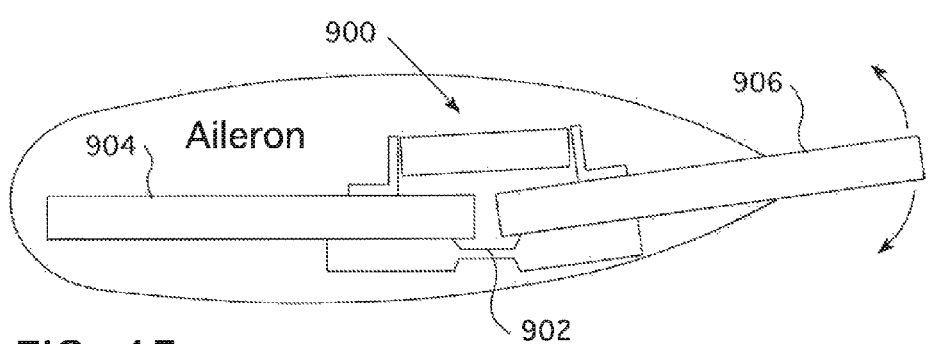
FIG. 45 illustrates the quick-connect dielectric elastomer transducer roll in combination with the living hinge coupling two substrates shown in FIG. 43 configured as an aileron in accordance with one embodiment of the present invention.

FIG. 45 illustrates the quick-connect dielectric elastomer transducer roll 900 in combination with the living hinge 902 shown in FIG. 43 coupling two substrates 904, 906 configured as an aileron in accordance with one embodiment of the present invention.

Figure 46:
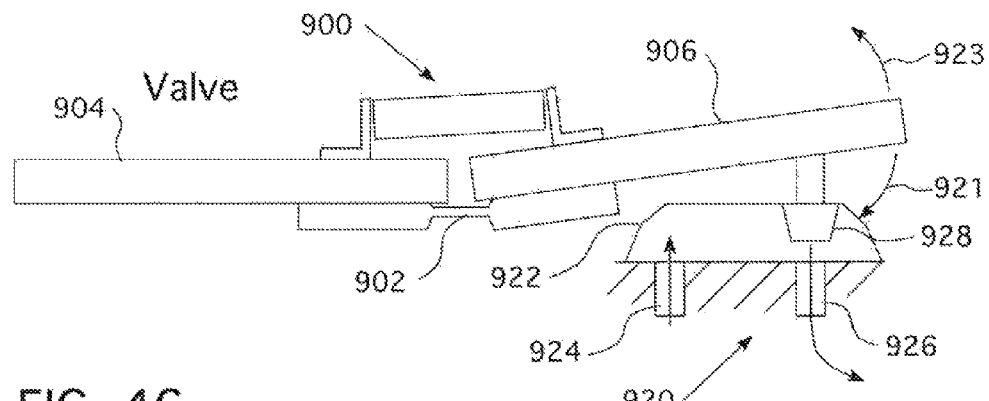
FIG. 46 illustrates the quick-connect dielectric elastomer transducer roll in combination with the living hinge coupling two substrates shown in FIG. 43 configured as a flow restrictor valve in accordance with one embodiment of the present invention.

FIG. 46 illustrates the quick-connect dielectric elastomer transducer roll 900 in combination with the living hinge 902 coupling two substrates 904, 906 shown in FIG. 43 configured as a flow restrictor valve 920 in accordance with one embodiment of the present invention. A flexible diaphragm 922 is positioned next to the movable substrate 906. An intake port 924 fluidically coupled to the flexible diaphragm 922 draws in the medium and an outlet port 926 fluidically coupled to the flexible diaphragm 922 delivers the medium from the flexible diaphragm 922. The flow through the outlet port 926 is regulated by a flow valve 928 coupled to the substrate 906. As the substrate 906 is positioned towards an opening of the outlet port 926 in direction 921, the flow of the medium is restricted. As the substrate 906 is positioned away from an opening of the outlet port 926 in direction 923, the flow is un-restricted.

Figure 47:
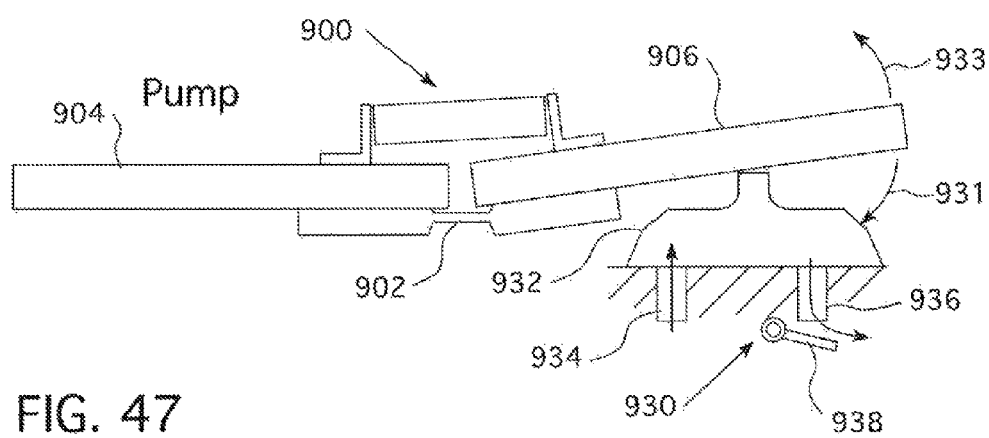
FIG. 47 illustrates the quick-connect dielectric elastomer transducer roll in combination with the living hinge coupling two substrates shown in FIG. 43 configured as a pump in accordance with one embodiment of the present invention.

FIG. 47 illustrates the quick-connect dielectric elastomer transducer roll 900 in combination with the living hinge 902 coupling two substrates 904, 906 shown in FIG. 43 configured as a pump 930 in accordance with one embodiment of the present invention. A flexible diaphragm 932 is positioned next to the movable substrate 906. A flap 938 is coupled to the outlet port 936 such that it closes during an up-stroke 933 of the substrate 906 and opens during a down-stroke 931 of the substrate 906. An intake port 934 fluidically coupled to the flexible diaphragm 932 draws in the medium for the pump during the up-stroke 933 and an outlet port 936 fluidically coupled to the flexible diaphragm 932 delivers the medium from the flexible diaphragm 932 during the down-stroke 931.

Figure 48:
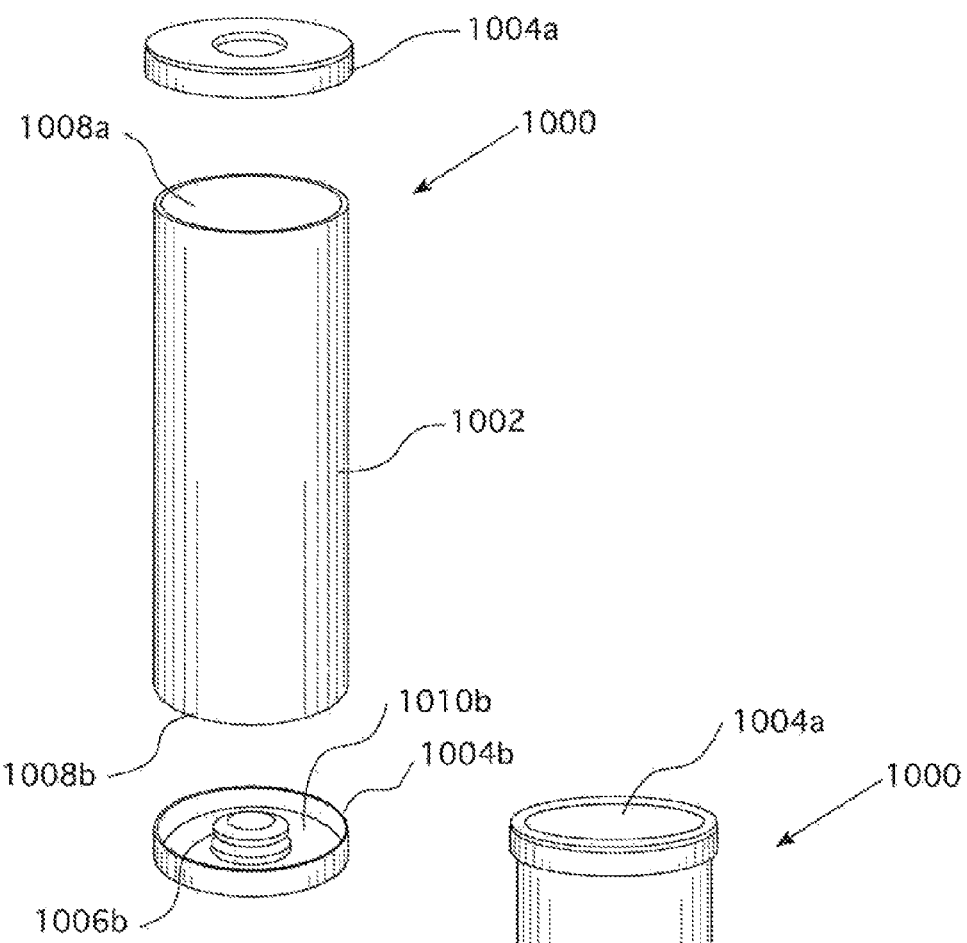
FIG. 48 is an exploded view of a compression dielectric elastomer transducer roll comprising a dielectric elastomer transducer roll and electrical terminals coupled to each end of the transducer roll in accordance with one embodiment of the present invention.

FIG. 48 is an exploded view of a compression dielectric elastomer transducer roll 1000 comprising a dielectric elastomer transducer roll 1002 and electrical terminals 1004a, 1004b coupled to each end of the transducer roll 1002 in accordance with one embodiment of the present invention. Each of the terminals 1004a, 1004b comprises a cup 1010b and a protrusion 1006b (only shown for one terminal 1004b), which is configured to be compressed onto each end 1008a, 1008b of the transducer roll 1002. Conductive adhesive also may be used to make the bond between the terminals 1004a, 1004b and each end 1008a, 1008b or the transducer roll 1002 more permanent.

Figure 49:
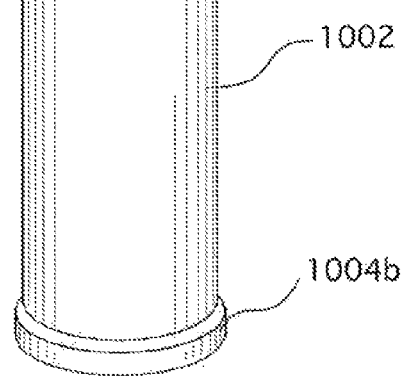
FIG. 49 is a perspective view of the assembled compression dielectric elastomer transducer roll comprising electrical terminals attached to each end of the each end of the dielectric elastomer transducer roll by a conductive adhesive in accordance with one embodiment of the present invention.

FIG. 49 is a perspective view of the assembled compression dielectric elastomer transducer roll 1000 comprising the electrical terminals 1004a, 1004b attached to each end of the each end of the dielectric elastomer transducer roll 1002 by a conductive adhesive in accordance with one embodiment of the present invention.

As for other details of the present invention, materials and alternate related configurations may be employed as within the level of those with skill in the relevant art. The same may hold true with respect to process-based aspects of the invention in terms of additional acts as commonly or logically employed. In addition, though the invention has been described in reference to several examples, optionally incorporating various features, the invention is not to be limited to that which is described or indicated as contemplated with respect to each variation of the invention. Various changes may be made to the invention described and equivalents (whether recited herein or not included for the sake of some brevity) may be substituted without departing from the true spirit and scope of the invention. Any number of the individual parts or subassemblies shown may be integrated in their design. Such changes or others may be undertaken or guided by the principles of design for assembly.

Although generally described herein in terms of a solid dielectric elastomer transducer roll, those skilled in the art will recognize that the present invention is equally applicable to all types of transducer architecture including dielectric elastomer rolls, solid dielectric elastomer rolls, and dielectric elastomer multi-layer stacks.

Various aspects of the subject matter described herein are set out in the following numbered clauses in any combination thereof:

1. A dielectric elastomer transducer comprising a first end and a second end, wherein a first electrical terminal is connected to the first end of the dielectric elastomer transducer; and a second electrical terminal is connected to the second end of the dielectric elastomer transducer.

2. The dielectric elastomer transducer according to Claim 1, further comprising a conductive adhesive connecting the first and second electrical terminals to the respective first and second ends of the dielectric elastomer transducer.

3. The dielectric elastomer transducer according to Claim 1, wherein the first and second electrical terminals each comprise a cap defining a cavity to receive therein one end of the dielectric elastomer transducer.

4. The dielectric elastomer transducer according to Claim 1, wherein the first and second electrical terminals each comprise a quick-connect terminal.

5. The dielectric elastomer transducer according to Claim 4, wherein the quick-connect terminal comprises a first and a second cantilever spring defining a space capable of slidably receiving a conductive male pin.

6. The dielectric elastomer transducer according to Claim 1, wherein the first and second electrical terminals each comprise a ring connect terminal comprising an axial portion and a metal ring or wherein the first and second electrical terminals comprise a cup with a protrusion configured to compress onto the respective first and second ends of the dielectric elastomer transducer.

7. A system, comprising a dielectric elastomer transducer comprising a first end and a second end; a first electrical terminal connected to the first end of the dielectric elastomer transducer; a second electrical terminal connected to the second end of the dielectric elastomer transducer; a substrate; a conductive flexure comprising one end attached to the substrate and another end configured to receive a load; a first electrical connector pin attached to the flexure to receive the first electrical terminal; and a second electrical connector pin attached to the substrate to receive the second electrical terminal.

8. The system according to Claim 7, wherein the first and second electrical terminals are quick-connect female connectors and the first and second connector are male pins.

9. The system according to Claim 7, wherein the first pin is electrically coupled to the flexure.

10. The system according to Claim 7, wherein the second pin is a 90° male pin comprising a base portion configured to be mounted to the substrate.

11. The system according to Claim 7, wherein the flexure comprises a base portion to couple the one end of the flexure to the substrate.

12. The system according to Claim 11, wherein the substrate comprises, a first substrate comprising a first electrical connecter pin to receive the first electrical terminal; a second substrate comprising a second electrical connector pin to receive the second electrical terminal; wherein the system further includes a living hinge flexibly coupling the first and second substrates; and wherein at least one of the first and second substrates is movable in response to energizing the dielectric elastomer transducer.

13. The system according to Claim 12, further comprising a flexible diaphragm positioned next to the movable substrate; an intake port fluidically coupled to the flexible diaphragm to draw in a medium into the flexible diaphragm; and an outlet port fluidically coupled to the flexible diaphragm to deliver the medium from the flexible diaphragm.

14. The dielectric elastomer transducer of any one of Claims 1 to 14, wherein the transducer has an architecture selected from the group consisting of dielectric elastomer rolls, solid dielectric elastomer rolls, and dielectric elastomer multi-layer stacks.

Also, it is contemplated that any optional feature of the inventive variations described may be set forth and claimed independently, or in combination with any one or more of the features described herein. Reference to a singular item, includes the possibility that there are plural of the same items present. More specifically, as used herein and in the appended claims, the singular forms "a," "an," "said," and "the" include plural referents unless the specifically stated otherwise. In other words, use of the articles allow for "at least one" of the subject item in the description above as well as the claims below. It is further noted that the claims may be drafted to exclude any optional element. As such, this statement is intended to serve as antecedent basis for use of such exclusive terminology as "solely," "only" and the like in connection with the recitation of claim elements, or use of a "negative" limitation. Without the use of such exclusive terminology, the term "comprising" in the claims shall allow for the inclusion of any additional element—irrespective of whether a given number of elements are enumerated in the claim, or the addition of a feature could be regarded as transforming the nature of an element set forth in the claims. Stated otherwise, unless specifically defined herein, all technical and scientific terms used herein are to be given as broad a commonly understood meaning as possible while maintaining claim validity.

What is claimed is:

1. A dielectric elastomer transducer comprising:
a first end and a second end,
wherein a first electrical terminal is connected to the first end of the dielectric elastomer transducer,
wherein a second electrical terminal is connected to the second end of the dielectric elastomer transducer,
wherein the first and second electrical terminals each comprise a quick-connect terminal, and
wherein the quick connect terminal comprises a first and a second cantilever spring defining a space capable of slidably receiving a conductive male pin.

2. A system, comprising:
a dielectric elastomer transducer comprising a first end and a second end;
a first electrical terminal connected to the first end of the dielectric elastomer transducer;
a second electrical terminal connected to the second end of the dielectric elastomer transducer;
a substrate;
a conductive flexure comprising one end attached to the substrate and another end configured to receive a load;
a first electrical connector pin attached to the flexure to receive the first electrical terminal; and
a second electrical connector pin attached to the substrate to receive the second electrical terminal.

3. The system according to claim 2, wherein the first and second electrical terminals are quick-connect female connectors and the first and second connector are male pins.

4. The system according to claim 2, wherein the first pin is electrically coupled to the flexure.

5. The system according to claim 2, wherein the second pin is a 90° male pin comprising a base portion configured to be mounted to the substrate.

6. The system according to claim 2, wherein the flexure comprises a base portion to couple the one end of the flexure to the substrate.

7. The system according to claim 6, wherein the substrate comprises, a first substrate comprising a first electrical connecter pin to receive the first electrical terminal;
a second substrate comprising a second electrical connector pin to receive the second electrical terminal; and
wherein the system further includes a living hinge flexibly coupling the first second substrates; and wherein at least one of the first and second substrates is movable in response to energizing the dielectric elastomer transducer.

8. The system according to claim 7, further comprising:
a flexible diaphragm positioned next to the movable substrate;
an intake port fluidically coupled to the flexible diaphragm to draw in a medium into the flexible diaphragm; and
an outlet port fluidically coupled to the flexible diaphragm to deliver the medium from the flexible diaphragm.

9. The system according to claim 2, wherein the dielectric elastomer transducer has an architecture selected from the group consisting of dielectric elastomer rolls, solid dielectric elastomer rolls, and dielectric elastomer multi-layer stacks.

* * * * *